United States Patent [19]
Hollars et al.

[11] Patent Number: 6,156,171
[45] Date of Patent: Dec. 5, 2000

[54] SPUTTERING MAGNETRON

[75] Inventors: Dennis R. Hollars, Los Gatos; Delbert F. Waltrip, San Jose; Robert B. Zubeck, Los Altos; Josef Bonigut, Alamo; Robert M. Smith, Antioch; Gary L. Payne, Sunnyvale, all of Calif.

[73] Assignee: Seagate Technology, Inc., Scotts Valley, Calif.

[21] Appl. No.: 08/045,989

[22] Filed: Apr. 9, 1993

Related U.S. Application Data

[62] Division of application No. 07/681,866, Apr. 4, 1991, abandoned.

[51] Int. Cl.⁷ .................................................. C23C 14/34
[52] U.S. Cl. .............................. 204/298.25; 204/298.11; 204/298.19; 204/192.2
[58] Field of Search ............................ 204/192.12, 192.2, 204/298.03, 298.25, 298.26, 298.27, 298.28, 298.29, 298.19, 298.09, 298.11

[56] References Cited

U.S. PATENT DOCUMENTS

| | | | |
|---|---|---|---|
| 4,060,470 | 11/1977 | Clarke | 204/192.2 X |
| 4,749,465 | 6/1988 | Flint et al. | 204/192.12 X |
| 4,790,921 | 12/1988 | Bloomquist et al. | 204/192.12 |
| 4,810,346 | 3/1989 | Wolf et al. | 204/298.19 X |
| 4,865,708 | 9/1989 | Welty | 204/298.19 X |
| 4,869,797 | 9/1989 | Nagao et al. | 204/192.2 X |
| 4,892,633 | 1/1990 | Welty | 204/298.19 X |
| 4,894,133 | 1/1990 | Hedgcoth | 204/298.25 X |
| 4,939,046 | 7/1990 | Yazawa | 204/192.2 X |
| 4,964,968 | 10/1990 | Arita | 204/298.19 |
| 5,026,471 | 6/1991 | Latz et al. | 204/298.19 |
| 5,180,478 | 1/1993 | Hughes | 204/192.2 X |

OTHER PUBLICATIONS

Leybold Ag Model ZV 1200, "Inline System for sputtering Magnetic Data Storage Media", Vacuum Technology, p. 1–8, Feb. 11, 1991.

*Primary Examiner*—Nam Nguyen
*Attorney, Agent, or Firm*—Fleisler, Dubb, Meyer & Lovejoy LLP

[57] ABSTRACT

An apparatus in accordance with the present invention provides a single or multi-layer coating to the surface of a plurality of substrates. The apparatus may include a plurality of buffer and sputtering chambers, and an input end and an output end, wherein said substrates are transported through said chambers of said apparatus at varying rates of speed such that the rate of speed of a pallet from said input end to said output end is a constant for each of said plurality of pallets. A high throughput sputtering apparatus having a plurality of integrally matched components in accordance with the present invention may further include means for transporting a plurality of substrates through said sputtering chambers at variable velocities; means for reducing the ambient pressure within said sputtering chambers to a vacuum level within a pressure range sufficient to enable sputtering operation; means for heating said plurality of substrates to a temperature conducive to sputtering said coatings thereon, said means for heating providing a substantially uniform temperature profile over the surface of said substrates; and control means for providing control signals to and for receiving feedback input from, said sputtering chambers, means for transporting, means for reducing, and means for heating, said control means being programmable for allowing control over said means for sputtering, means for transporting, means for reducing and means for heating.

7 Claims, 36 Drawing Sheets

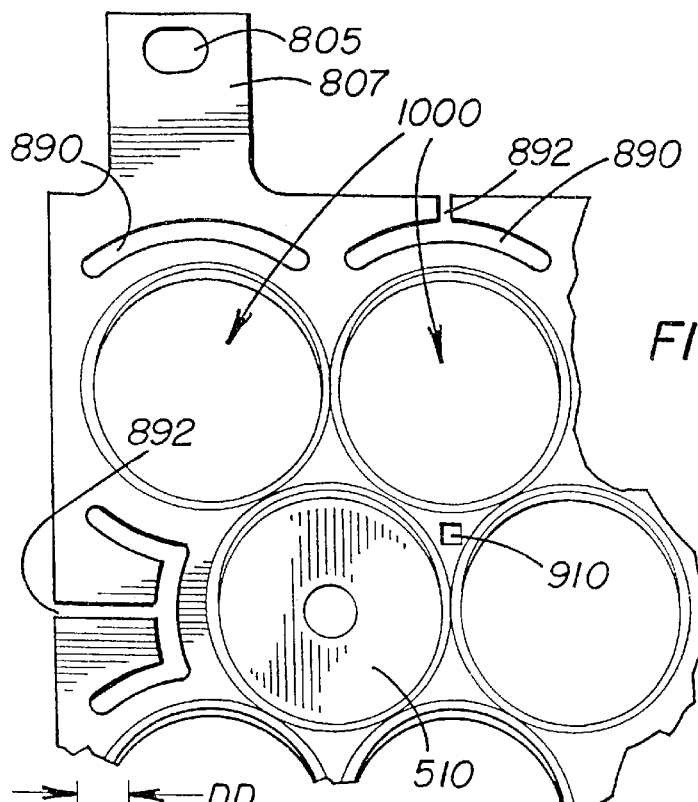
FIGURE 9
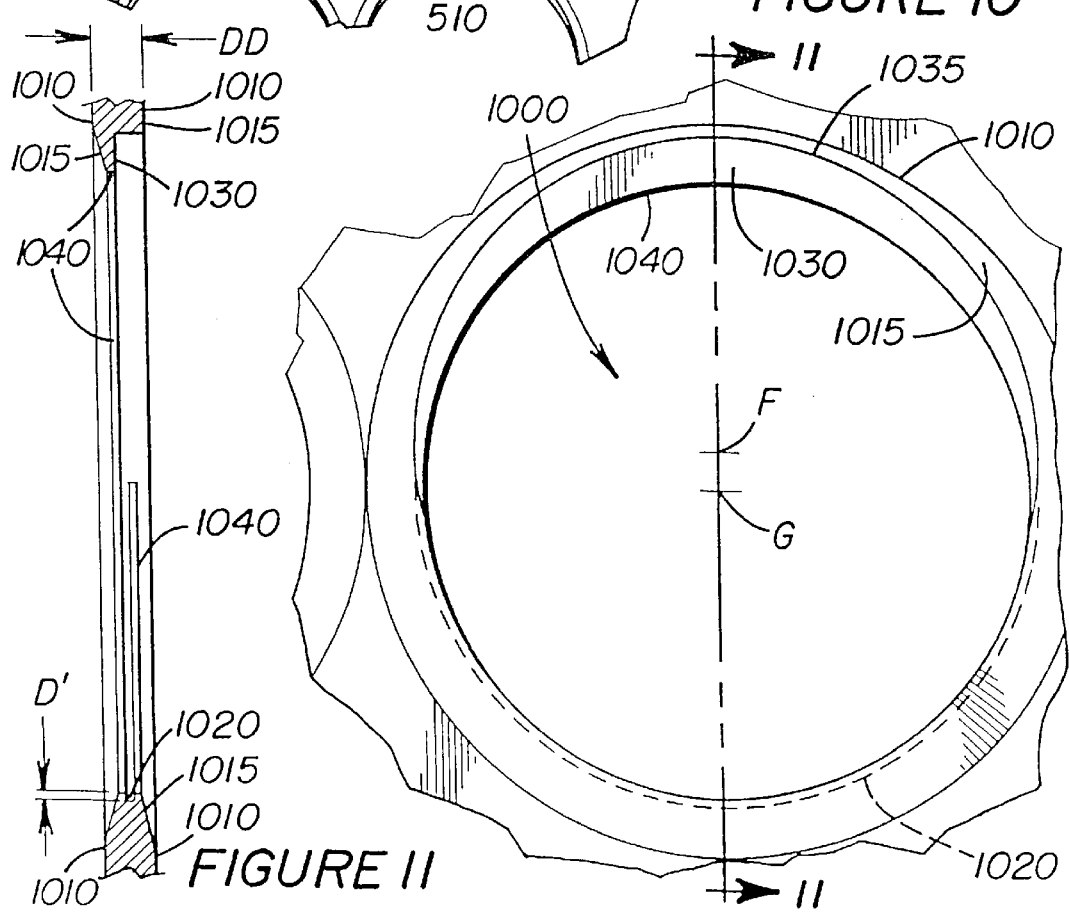
FIGURE 10
FIGURE 11

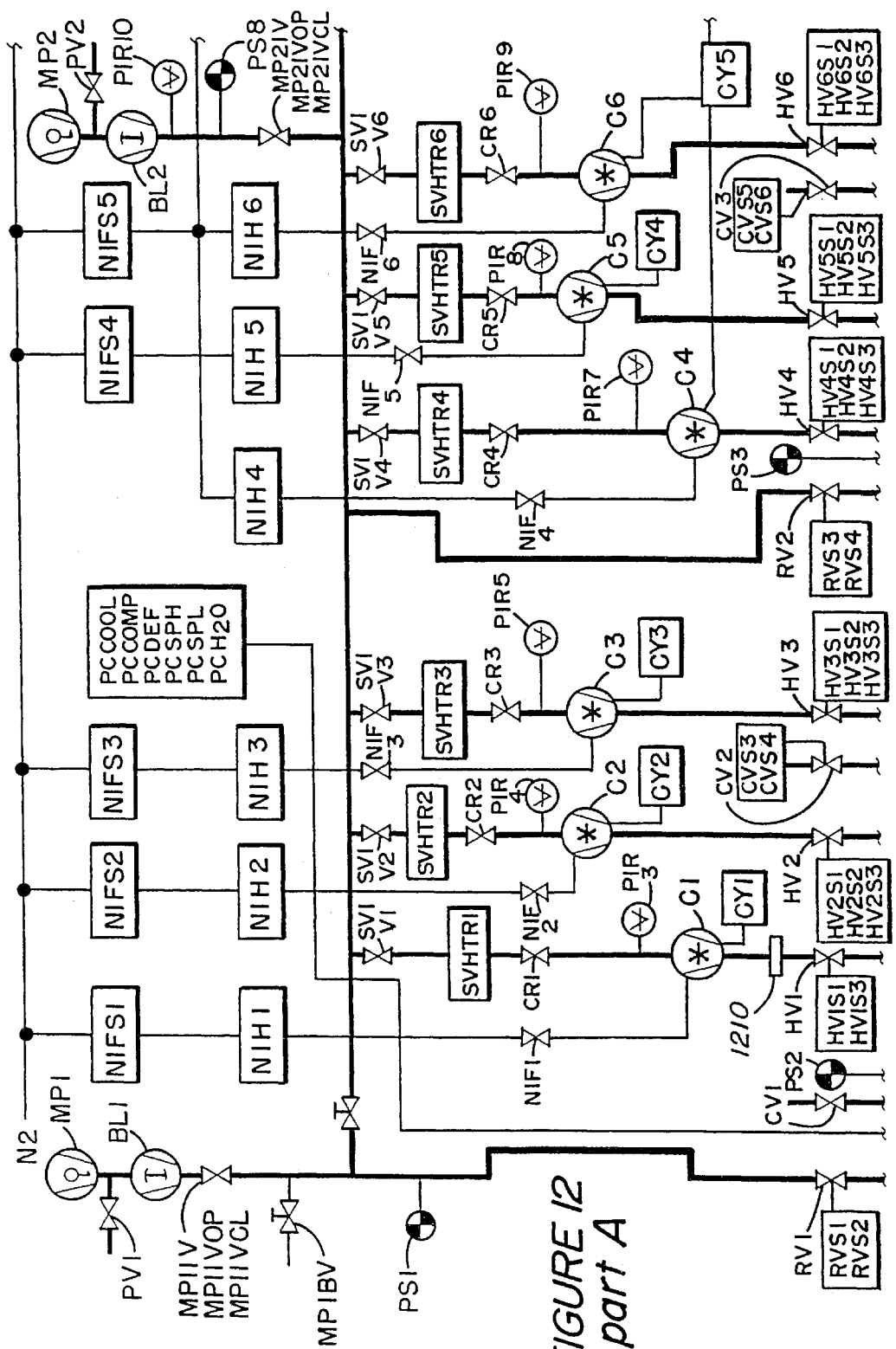
FIGURE 12 part A

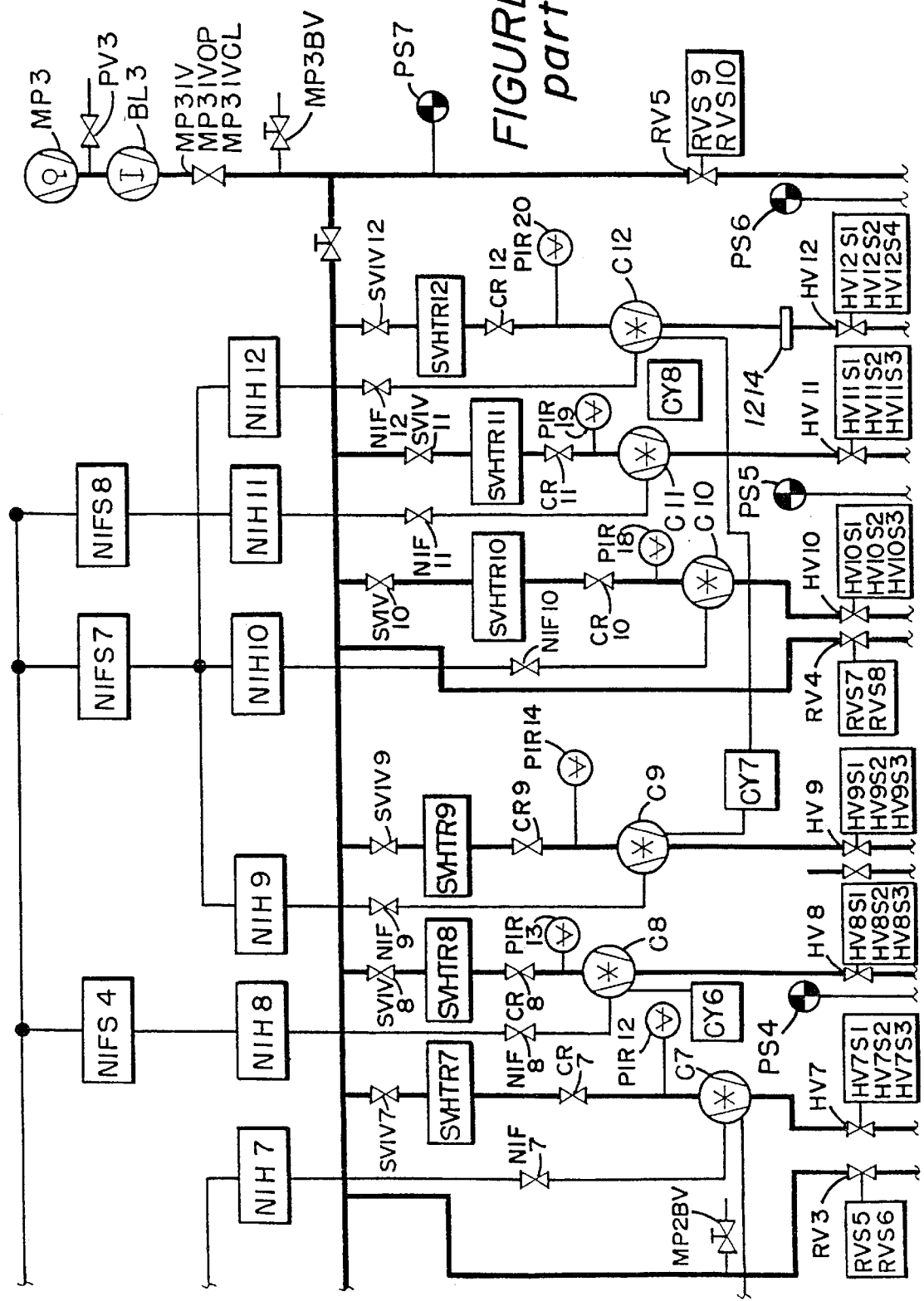

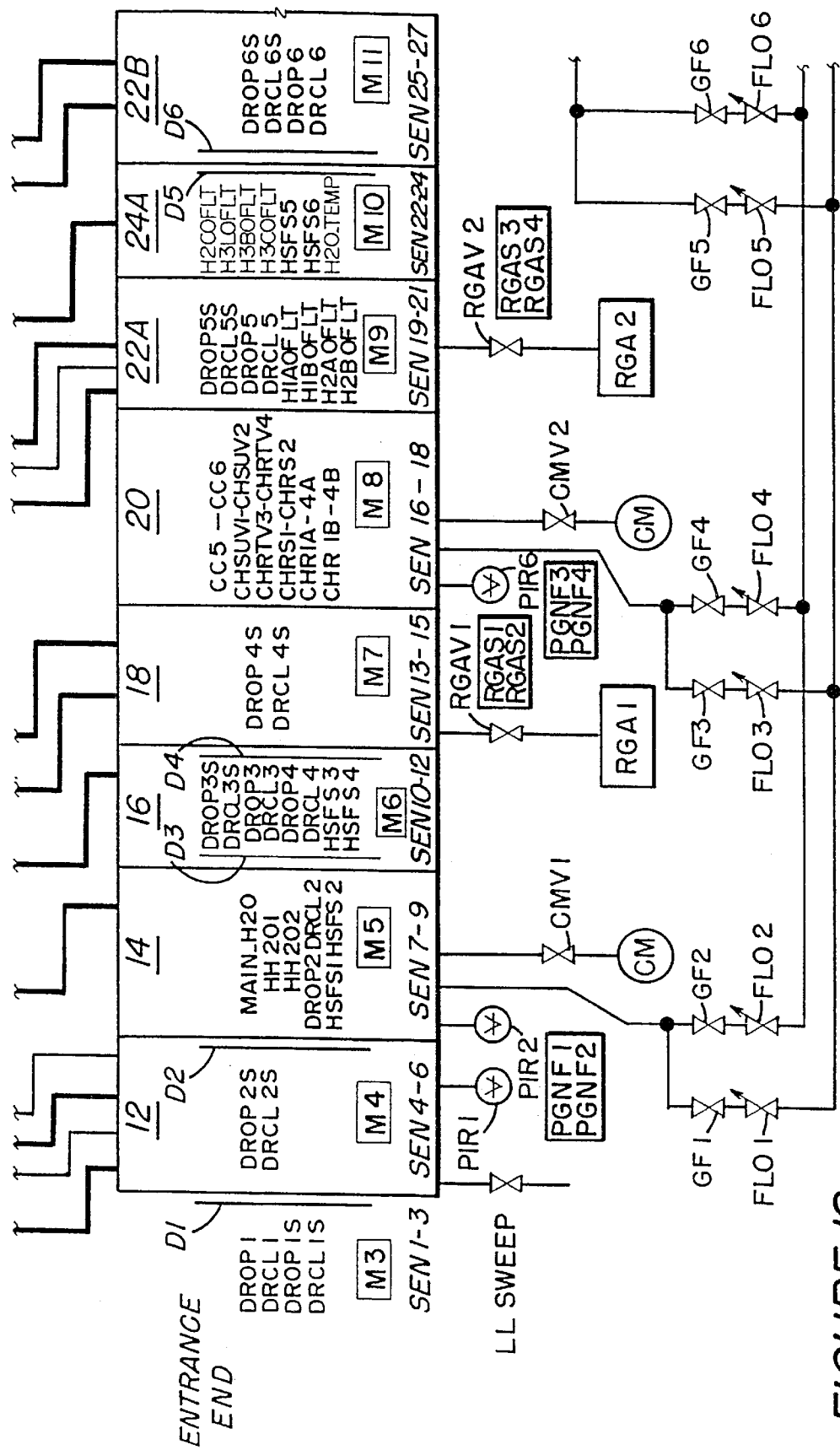
FIGURE 12 part C

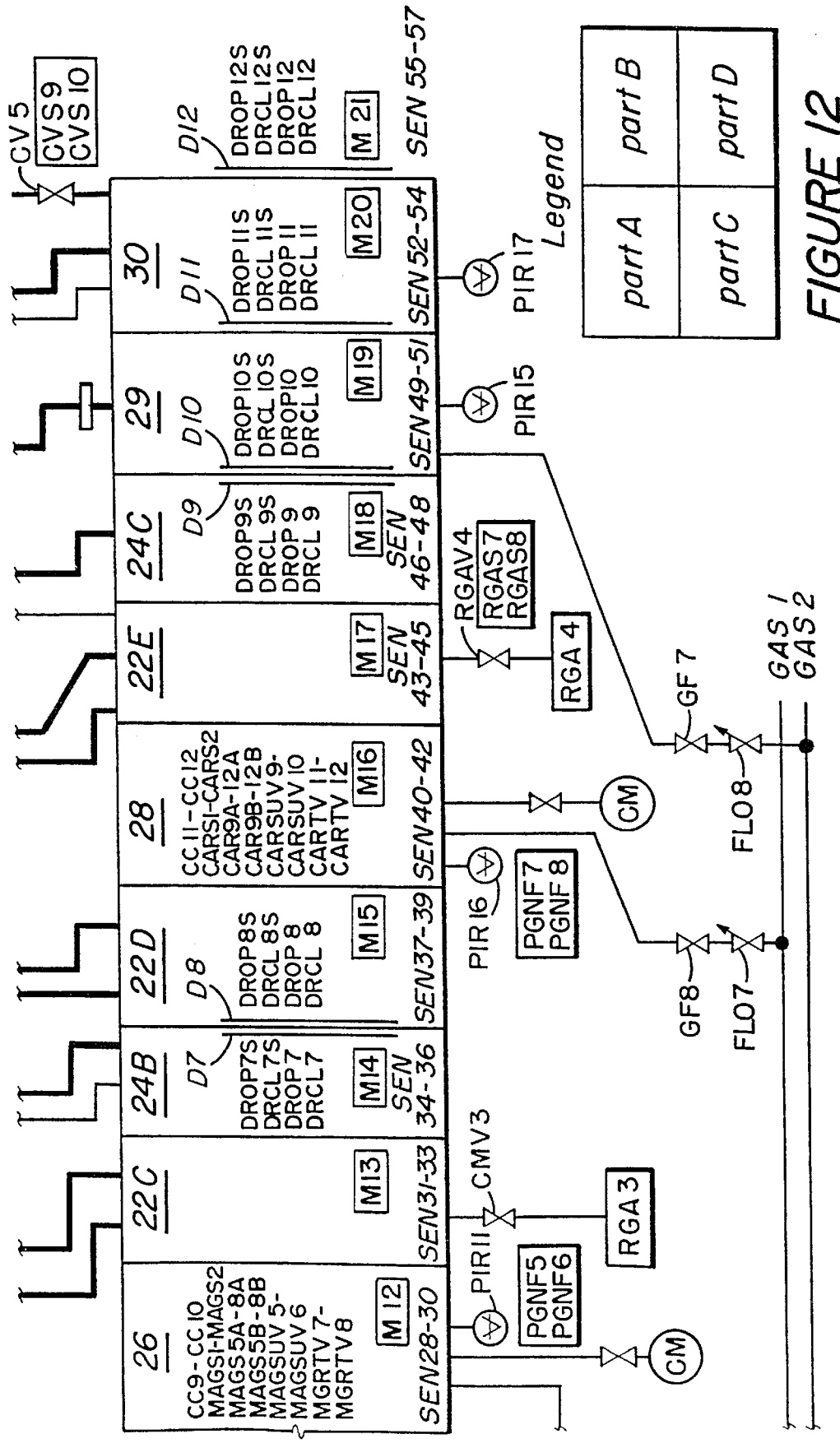
FIGURE 12 part D

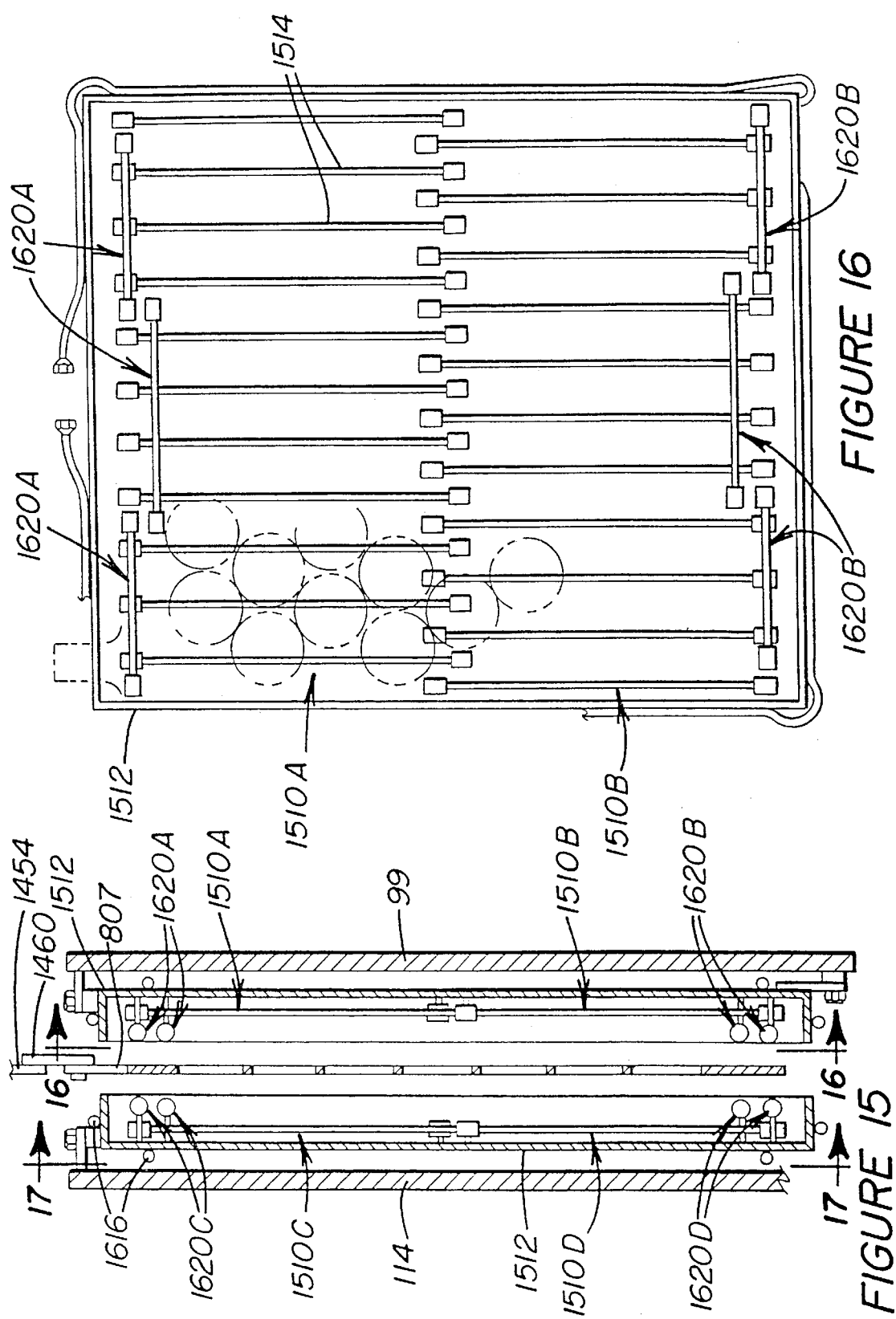

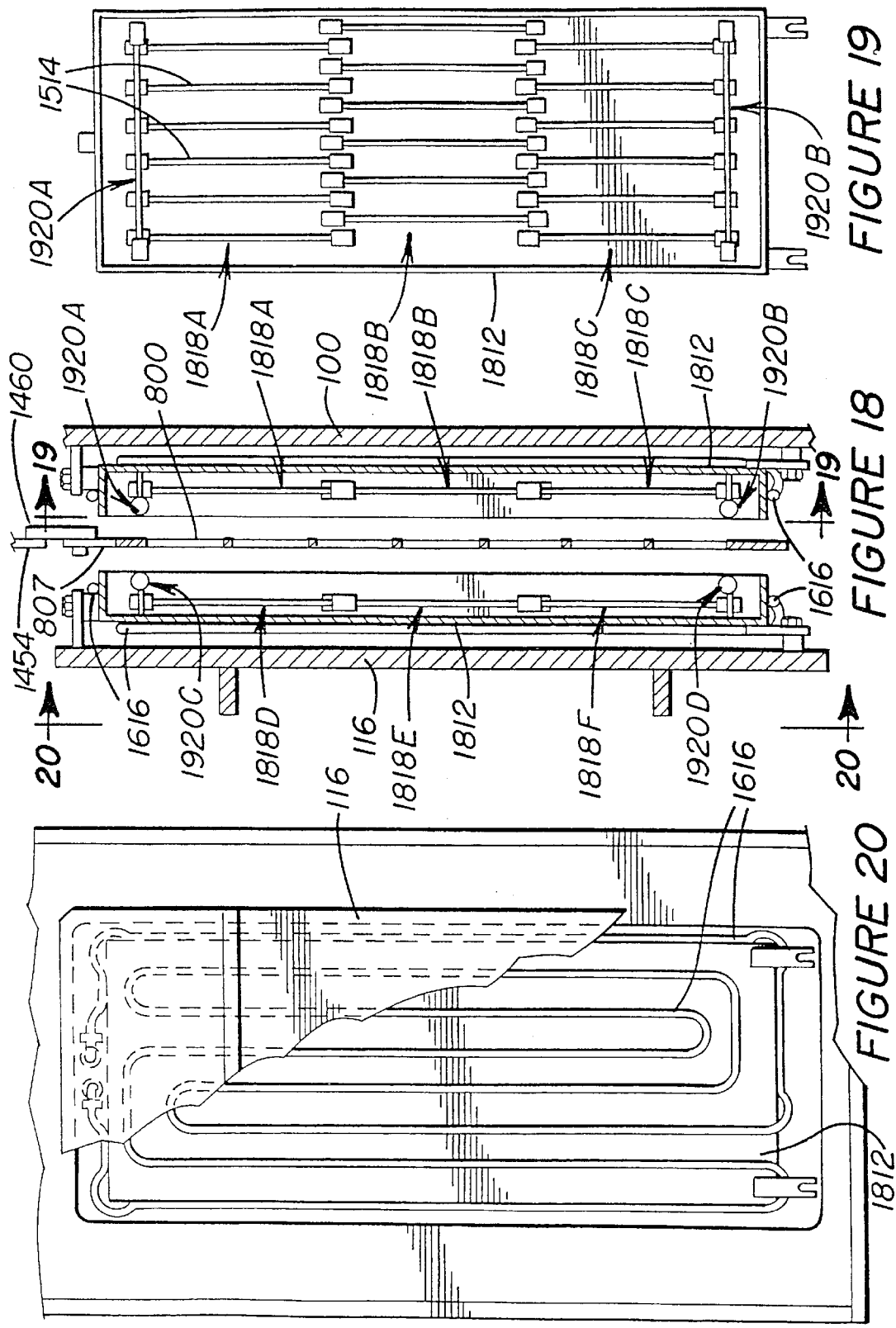

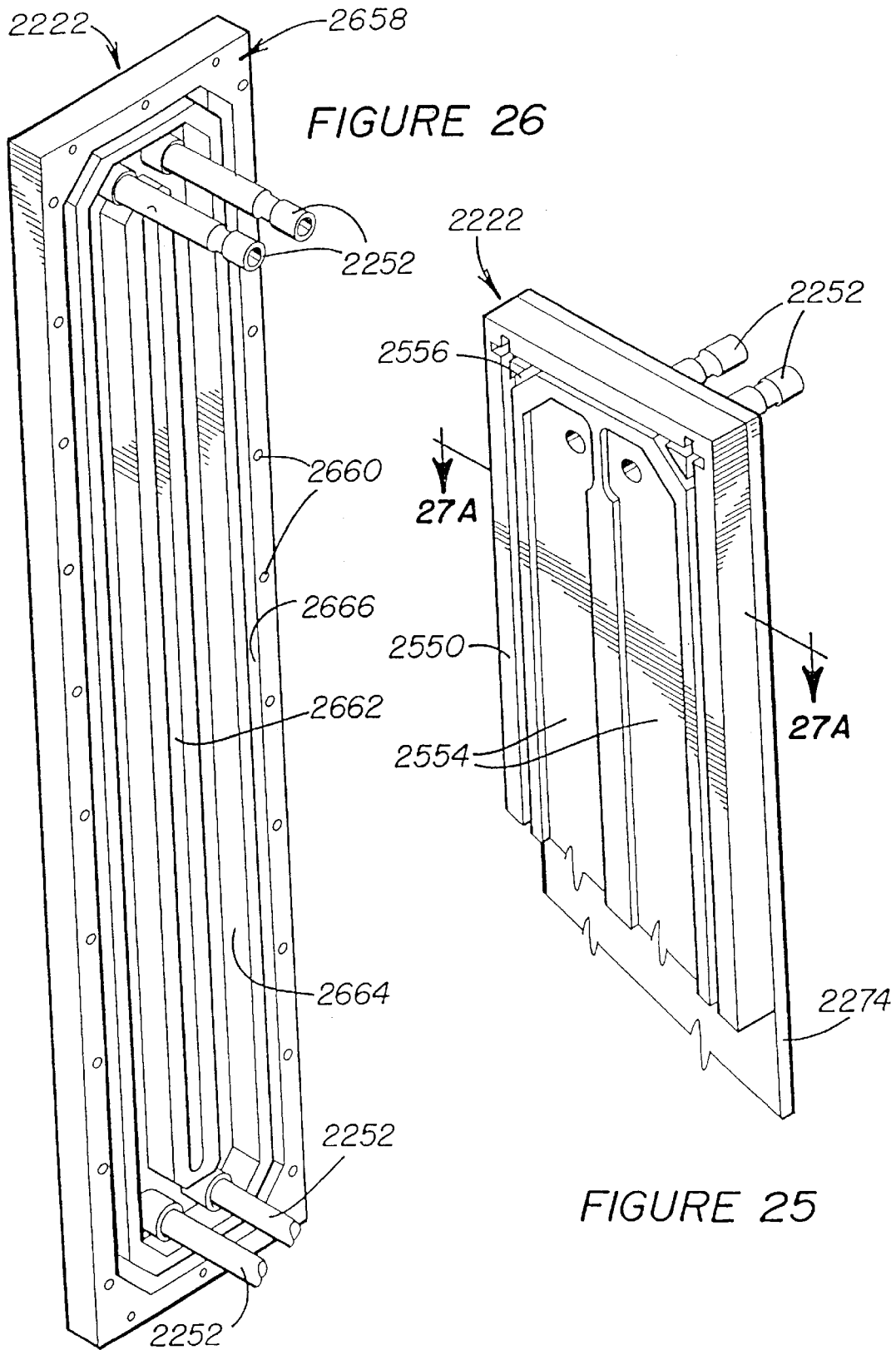

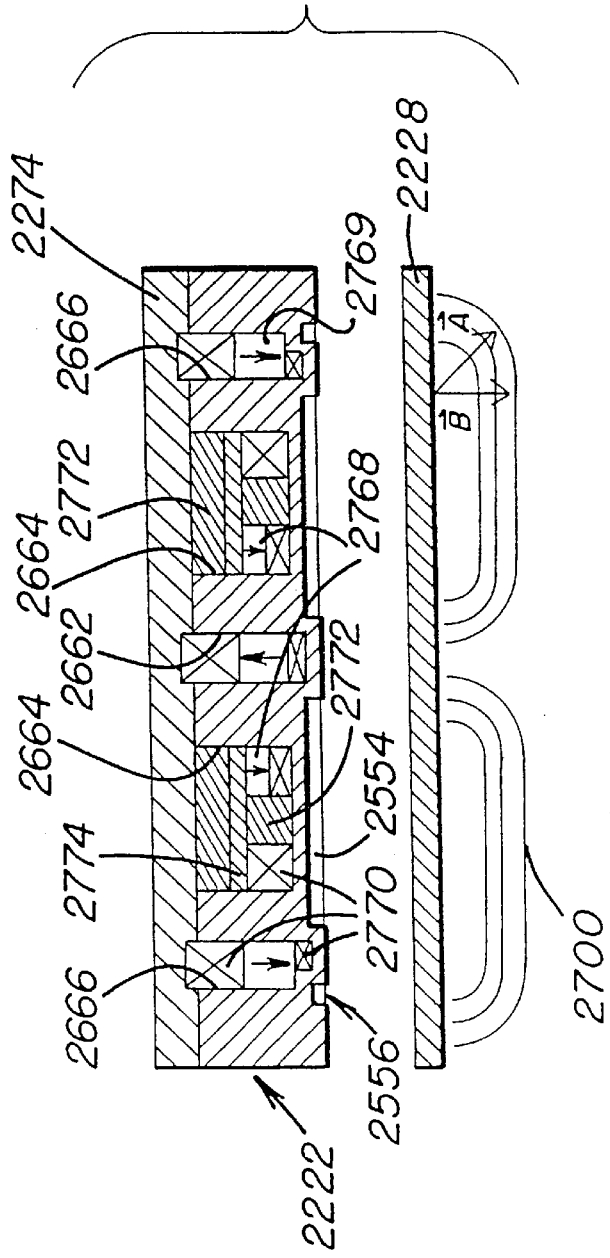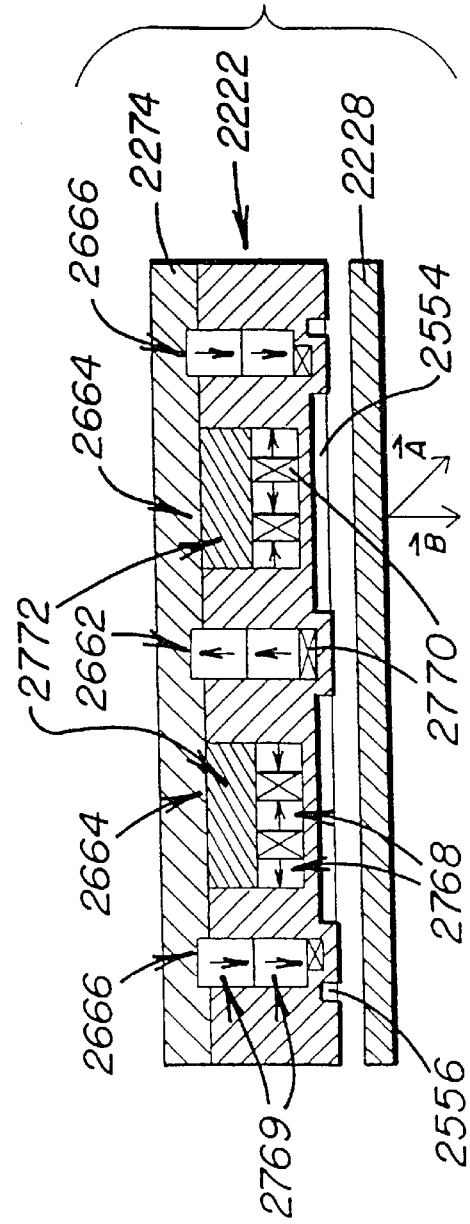

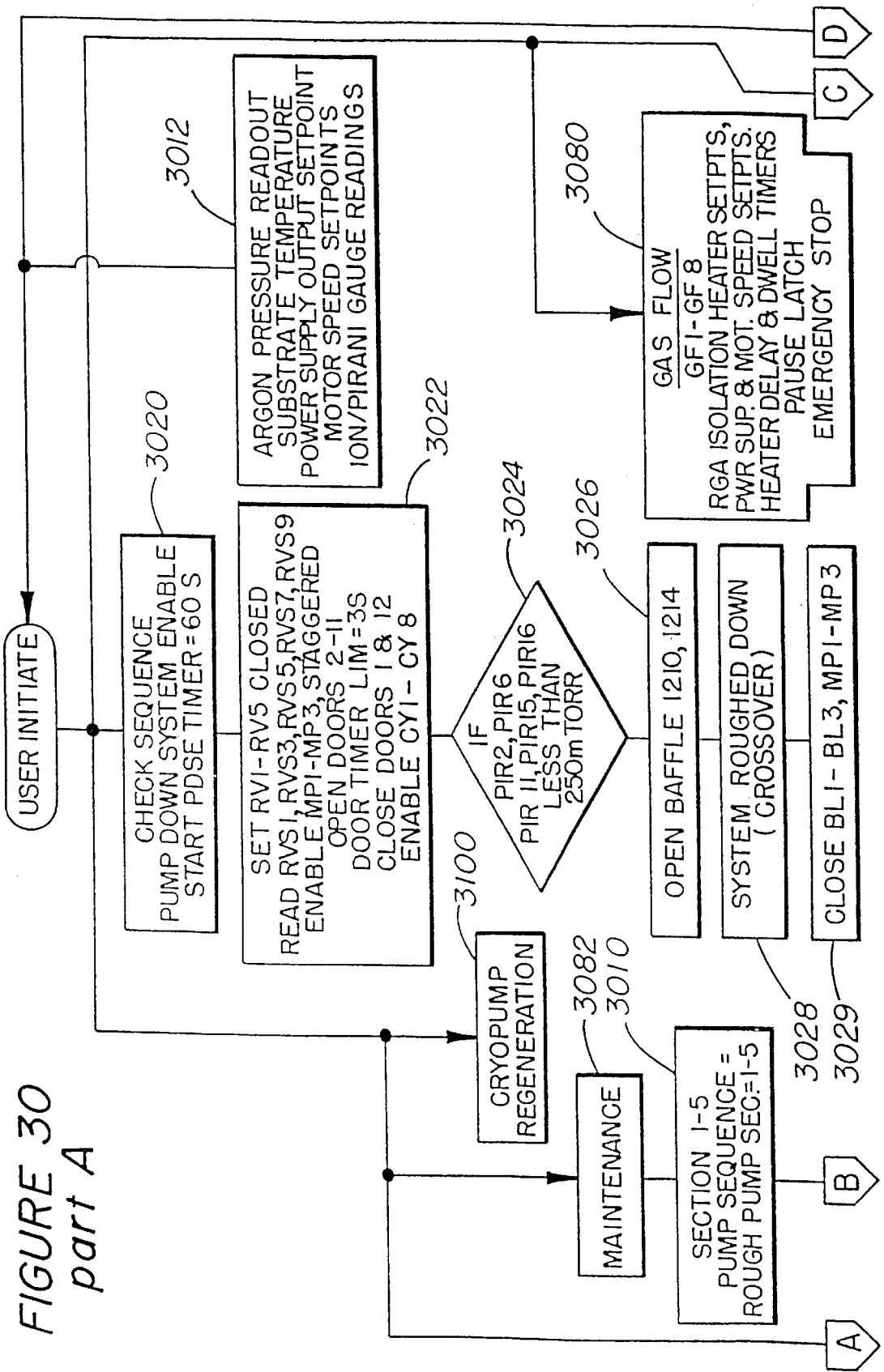
FIGURE 30 part A

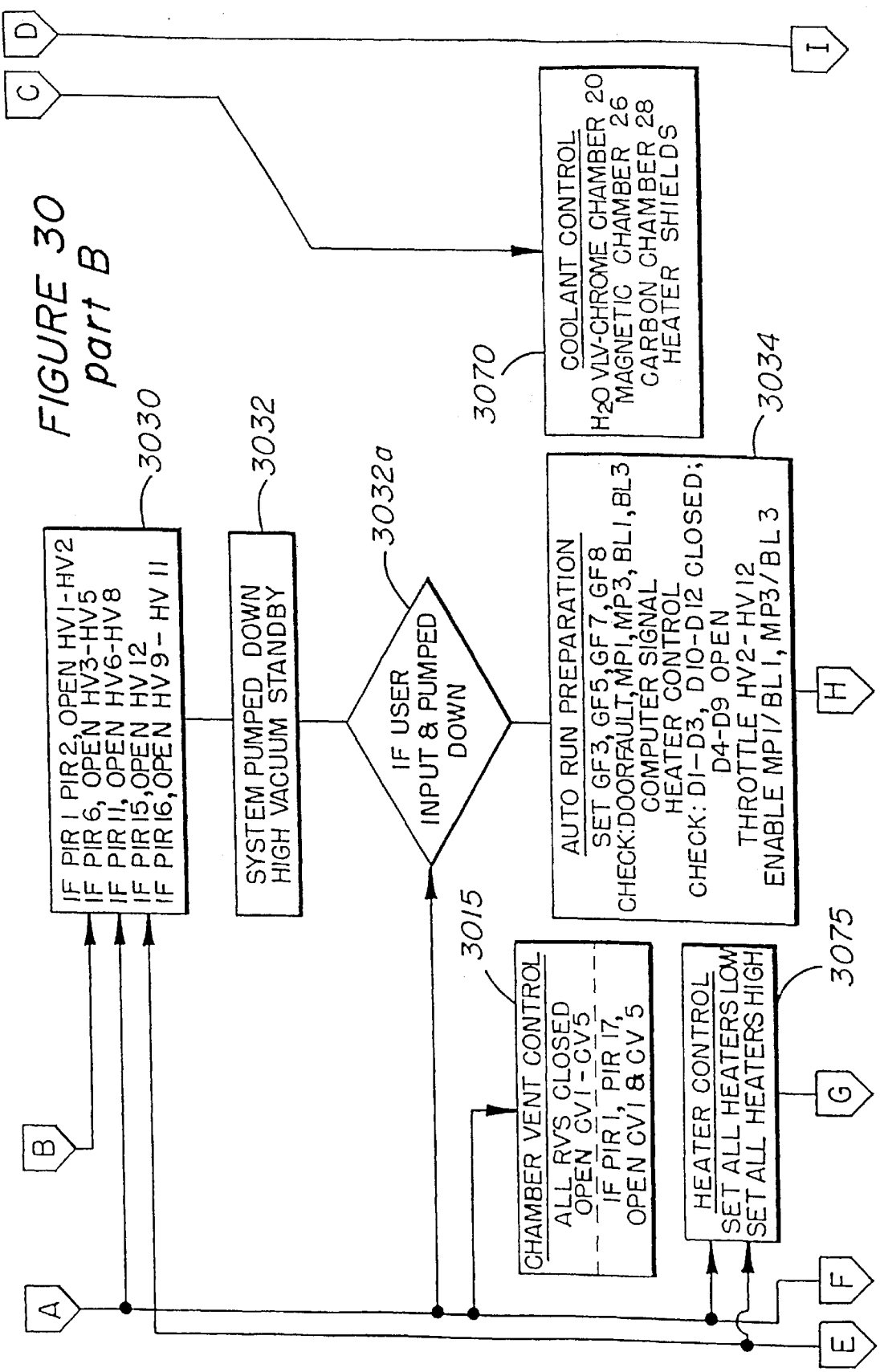

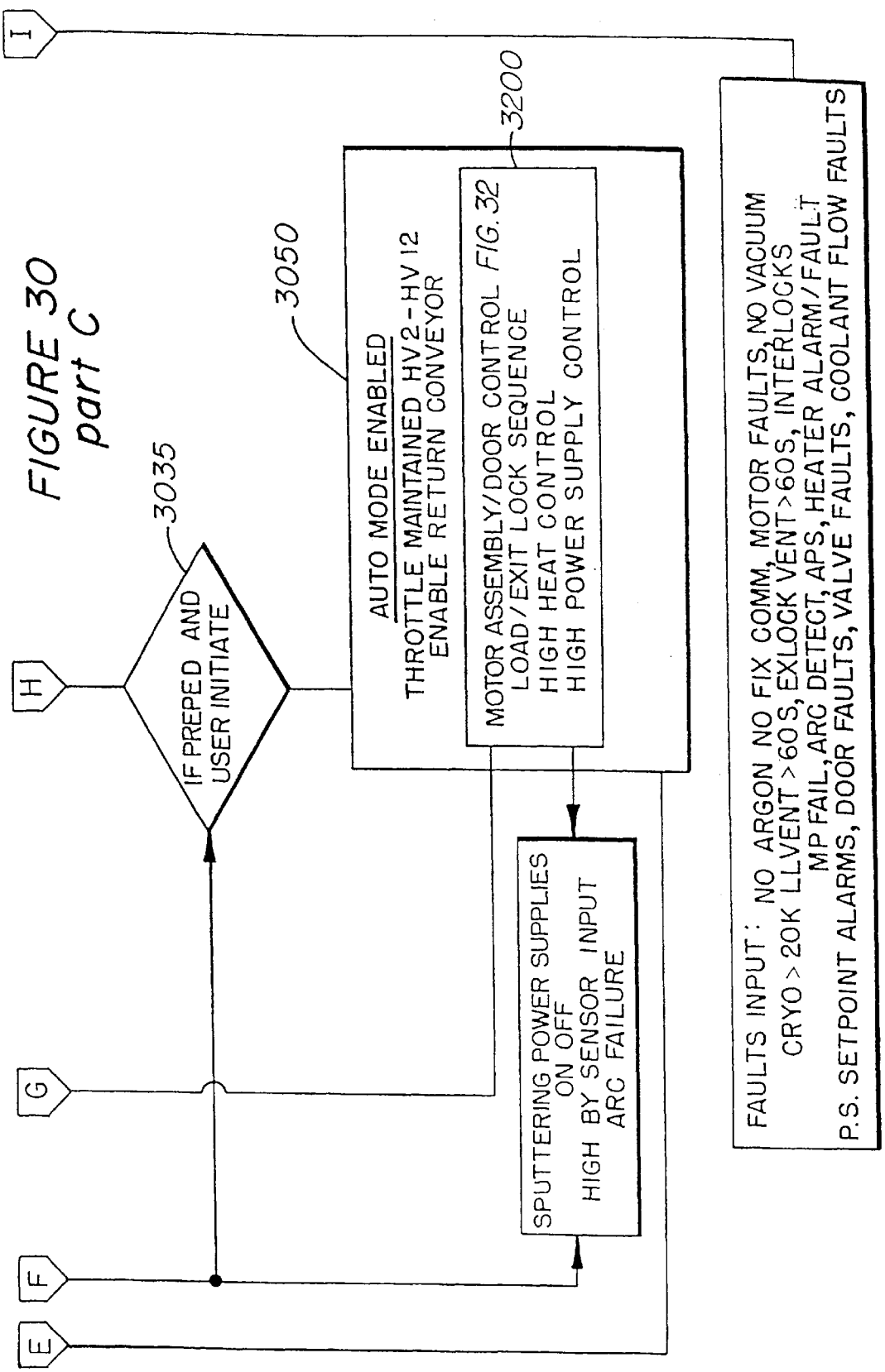

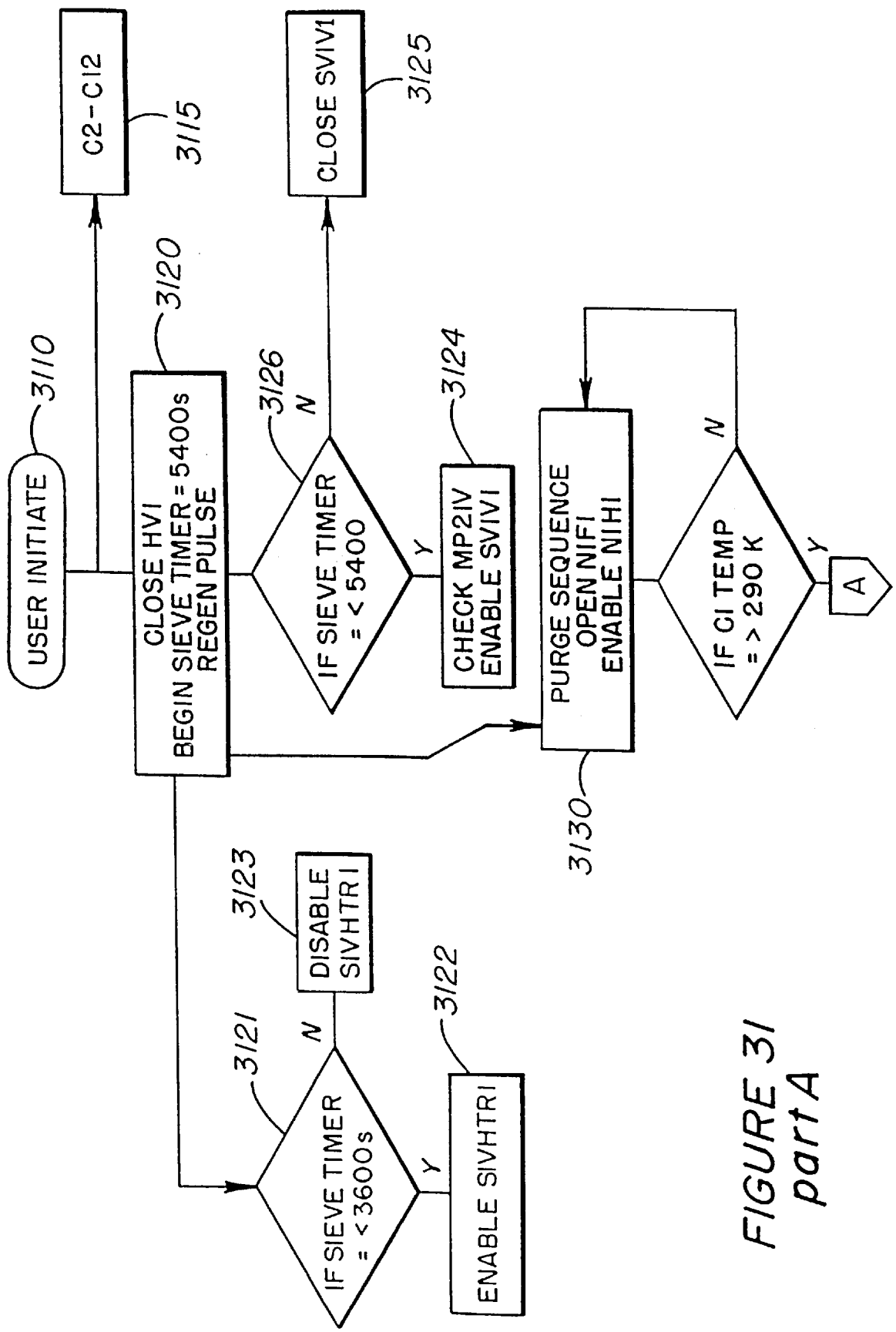
FIGURE 31 part A

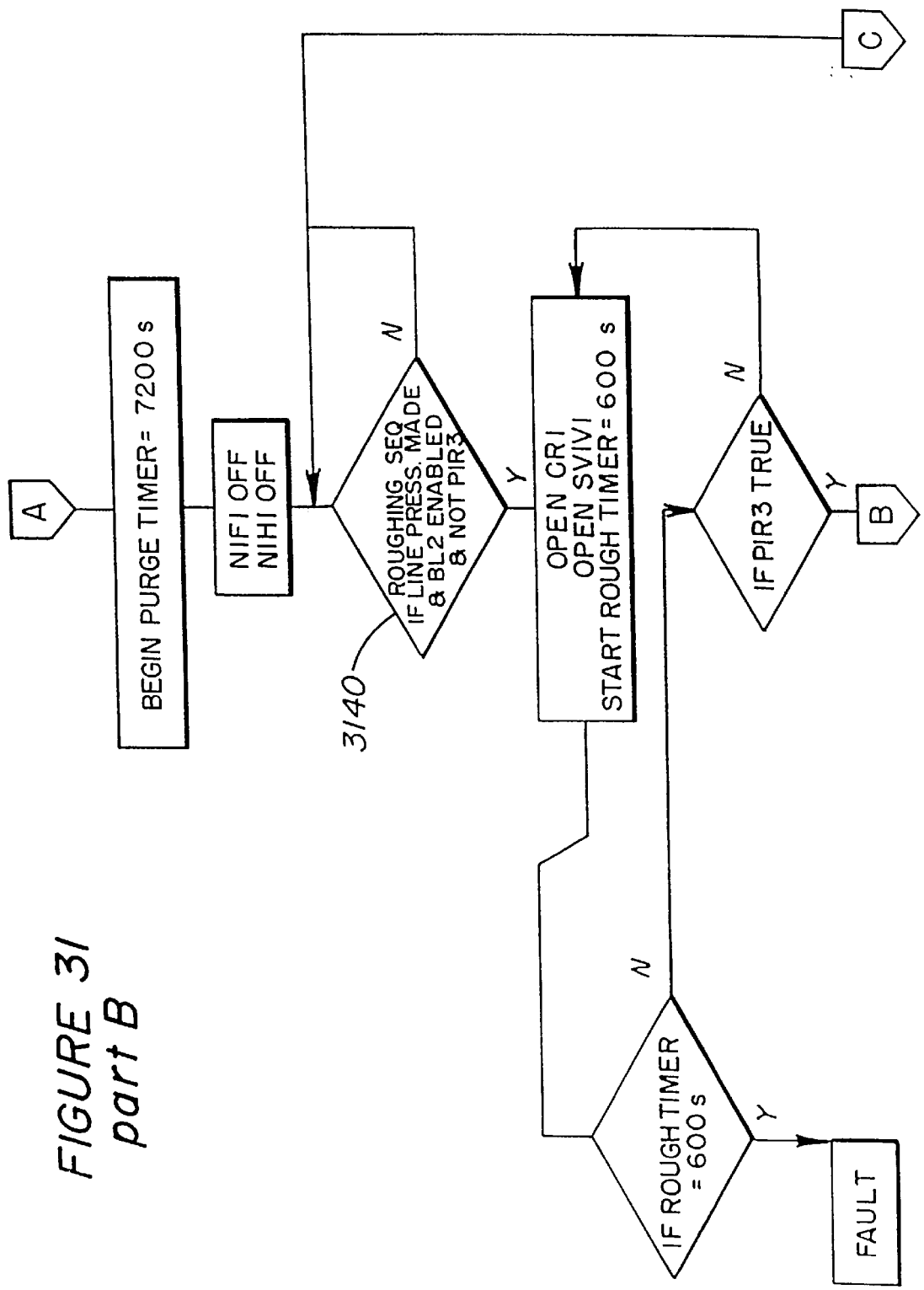
FIGURE 31 part B

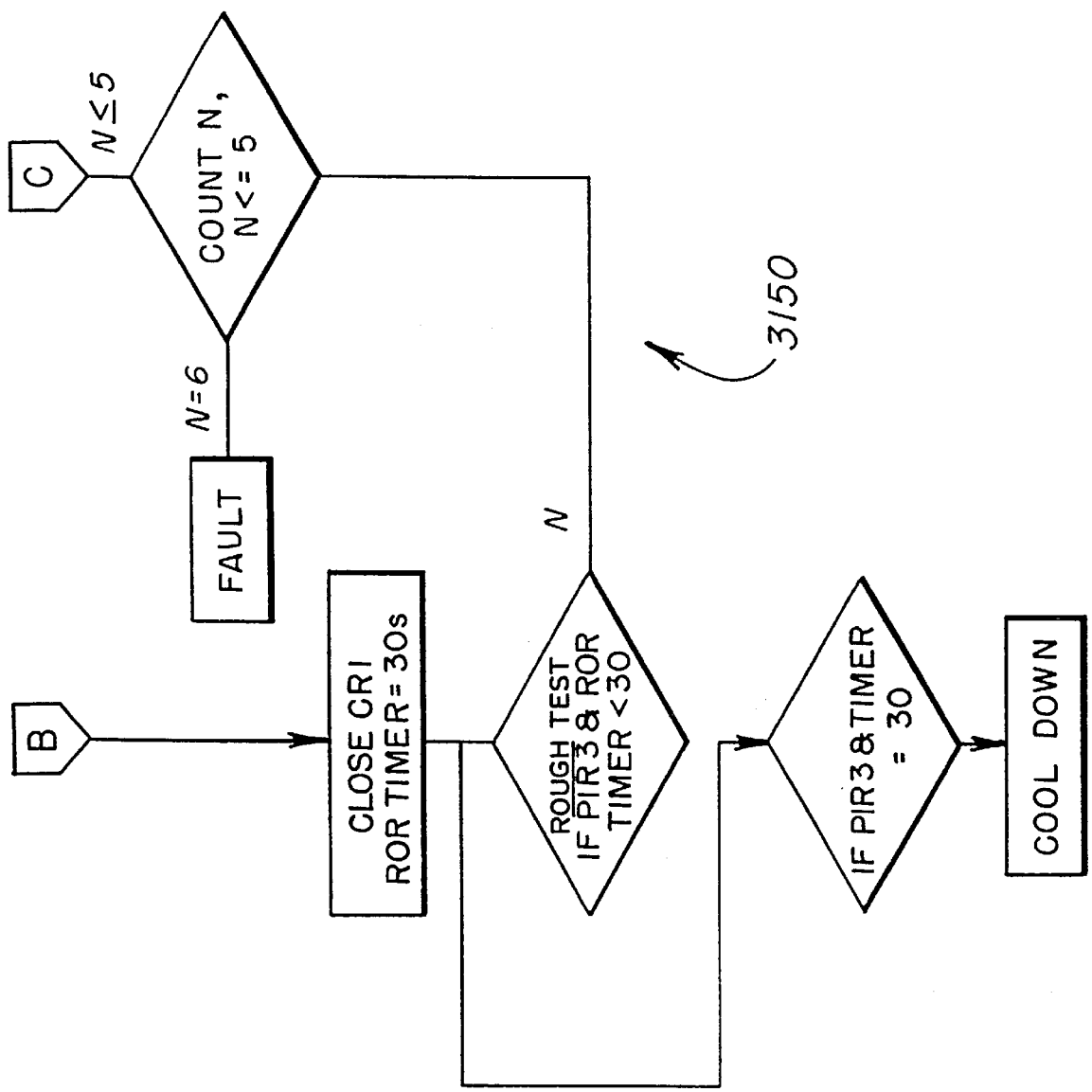
FIGURE 31 part C

SPUTTERING MAGNETRON

This application is a divisional of Ser. No. 07/681,866, filed Apr. 4, 1991 abandoned.

LIMITED COPYRIGHT WAIVER

A portion of the disclosure of this patent document contains material to which the claim of copyright protection is made. The copyright owner has no objection to the facsimile reproduction by any person of the patent document or the patent disclosure, as it appears in the U.S. Patent and Trademark Office file or records, but reserves all other rights whatsoever.

BACKGROUND OF THE INVENTION

1. Field of the Invention

The invention relates to an apparatus and method for depositing multilayer thin films in a magnetron sputtering process. More particularly, the invention relates to an apparatus and method for depositing thin magnetic films for magnetic recording media in a high volume, electronically controlled, magnetron sputtering process, and to production of an improved magnetic recording disk product thereby.

2. Description of the Related Art

Sputtering is a well-known technique for depositing uniform thin films on a particular substrate. Sputtering is performed in an evacuated chamber using an inert gas, typically argon, with one or more substrates remaining static during deposition, being rotated about the target (a "planetary" system) or being transported past the target (an "in-line" system).

Fundamentally, the technique involves bombarding the surface of a target material to be deposited as the film with electrostatically accelerated argon ions. Generally, electric fields are used to accelerate ions in the plasma gas, causing them to impinge on the target surface. As a result of momentum transfer, atoms and electrons are dislodged from the target surface in an area known as the erosion region. Target atoms deposit on the substrate, forming a film.

Typically, evacuation of the sputtering chamber is a two-stage process in order to avoid contaminant-circulating turbulence in the chamber. First, a throttled roughing stage slowly pumps down the chamber to a first pressure, such as about 50 microns. Then, high vacuum pumping occurs using turbo-, cryo- or diffusion pumps to evacuate the chamber to the highly evacuated base pressure (about $10^{-7}$ Torr) necessary to perform sputtering. Sputtering gas is subsequently provided in the evacuated chamber, backfilling to a pressure of about 2–10 microns.

The sputtering process is useful for depositing coatings from a plurality of target materials onto a variety of substrate materials, including glass, nickel-phosphorus plated aluminum disks, and ceramic materials. However, the relatively low sputtering rate achieved by the process solely relying on electrostatic forces (diode sputtering) may be impracticable for certain commercial applications where high volume processing is desired. Consequently, various magnet arrangements have been used to enhance the sputtering rate by trapping electrons close to the target surface, ionizing more argon, increasing the probability of impacting and dislodging target atoms and therefore the sputtering rate. In particular, an increased sputtering rate is achieved by manipulation of a magnetic field geometry in the region adjacent to the target surface.

Sputter deposition performed in this manner is generally referred to as magnetron sputtering.

The magnetic field geometry may be optimized by adjusting the polarity and position of individual magnets used to generate magnetic fields with the goal of using the magnetic field flux paths to enhance the sputtering rate. For example, U.S. Pat. No. 4,166,018, issued Aug. 28, 1989 to J. S. Chapin and assigned to Airco, Inc., describes a planar direct current (d.c.) magnetron sputtering apparatus which uses a magnet configuration to generate arcuate magnetic flux paths (or lines) that confine she electrons and ions in a plasma region immediately adjacent to the target erosion region. A variety of magnet arrangements are suitable for this purpose, as long as one or more closed loop paths of magnetic flux is parallel to the cathode surface, e.g., concentric ovals or circles.

The role of the magnetic field is to trap moving electrons near the target. The field generates a force on the electrons, inducing the electrons to take a spiral path about the magnetic field lines. Such a spiral path is longer than a path along the field lines, thereby increasing the chance of the electron ionizing a plasma gas atom, typically argon. In addition, field lines also reduce electron repulsion away from a negatively biased target. As a result, a greater ion flux is created in the plasma region adjacent to the target with a correspondingly enhanced erosion of target atoms from an area which conforms to a shape approximating the inverse shape of the field lines. Thus, if the field above the target is configured in arcuate lines, the erosion region adjacent to the field lines conforms to a shallow track, leaving much of the target unavailable for sputtering.

Even lower target utilization is problematic for magnetic targets because magnetic field lines tend to be concentrated within, and just above, a magnetic target. With increasing erosion of the magnetic target during sputtering, the field strength above the erosion region increases as more field lines 'leak' out from the target, trapping more electrons and further intensifying the plasma close to the erosion region. Consequently, the erosion region is limited to a narrow valley.

In addition to achieving high film deposition rates, sputtering offers the ability to tailor film properties to a considerable extent by making minor adjustments to process parameters. Of particular interest are processes yielding films with specific crystalline microstructures and magnetic properties. Consequently, much research has been conducted on the effects of sputtering pressures, deposition temperature and maintenance of the evacuated environment to avoid contamination or degradation of the substrate surface before film deposition.

Alloys of cobalt, nickel and chromium deposited on a chromium underlayer (CoNiCr/Cr) are highly desirable as films for magnetic recording media such as disks utilized in Winchester-type hard disk drives. However, on disk substrates, in-line sputtering processes create magnetic anisotropies which are manifested as signal waveform modulations and anomalies in the deposited films.

Anisotropy in the direction of disk travel through such in-line processes is understood to be caused by crystalline growth perpendicular to the direction of disk travel as a result of the deposition of the obliquely incident flux of target atoms as the disk enters and exits a sputtering chamber. Since magnetic film properties depend on crystalline microstructure, such anisotropy in the chromium underlayer can disrupt the subsequent deposition of the magnetic CoNiCr layer in the preferred orientation. The preferred crystalline orientation for the chromium underlayer is with the closely packed, bcc {110} plane parallel to the film surface. This orientation for the chromium nucleating layer forces the 'C' axis of the hcp structure of the magnetic cobalt-alloy layer, i.e., the easy axis of magnetization, to be aligned in the film plane. Similarly, the orientation of the magnetic field generated in the sputtering process may induce an additional anisotropy which causes similar signal waveform modulations. See, Uchinami, et al., "Magnetic Anisotropies in Sputtered Thin Film Disks", *IEEE Trans. Magn.*, Vol. MAG-23, No. 5, 3408–10, September 1987, and Hill, et al., "Effects of Process Parameters on Low Frequency Modulation on Sputtered Disks for Longitudinal Recording", *J. Vac Sci. Tech.*, Vol. A4, No. 3, 547–9, May 1986 (describing magnetic anisotropy phenomena).

Several approaches have been taken to eliminate the aforementioned waveform modulation problems while enhancing magnetic properties in the coating, especially coercivity. For instance, U.S. Pat. No. 4,816,127, issued Mar. 28, 1989 to A. Eltoukhy and assigned to Xidex Corp., describes one means for shielding the substrate to intercept the obliquely incident target atoms. In addition, Teng, et al., "Anisotropy-Induced Signal Waveform Modulation of DC Magnetron Sputtered Thin Films", *IEEE Trans. Magn.*, Vol. MAG-22, 579–581, 1986, and Simpson, et al., "Effect of Circumferential Texture on the Properties of Thin Film Rigid Recording Disks". *IEEE Trans. Magn.*, Vol. MAG-23, No. 5, 3405–7, September 1987, suggest texturizing the disk substrate surface prior to film deposition. In particular, the authors propose circumferential surface grooves to promote circumferentially oriented grain growth and thereby increase film coercivity.

Other approaches to tailoring film properties have focused on manipulating the crystalline microstructure by introducing other elements into the alloy composition. For example, Shiroishi, et al., "Read and Write Characteristics of Co-Alloy/Cr Thin Films for Longitudinal Recording", *IEEE Trans. Magn.*, Vol. MAG-24, 2730–2, 1988, and U.S. Pat. No. 4,652,499, issued Mar. 24, 1987 to J. K. Howard and assigned to IBM, relate to the substitution of elements such as platinum (Pt), tantalum (Ta), and zirconium (Zr) into cobalt-chromium (CoCr) films to produce higher coercivity and higher corrosion resistance in magnetic recording films.

CoCr alloys with tantalum (CoCrTa) are particularly attractive films for magnetic recording media. For example, it is known in the prior art to produce CoCrTa films by planetary magnetron sputtering processes using individual cobalt, chromium and tantalum targets or using cobalt-chromium and tantalum targets.

Fisher, et al., "Magnetic Properties and Longitudinal Recording Performance of Corrosion Resistant Alloy Films", *IEEE Trans. Magn.*, Vol. MAG 22, no. 5, 352–4, September 1986, describe a study of the magnetic and corrosion resistance properties of sputtered CoCr alloy films. Substitution of 2 atomic percent (at.%) Ta for Cr in a Co-16 at.% Cr alloy (i.e., creating a Co-14 at.% Cr-2 at.% Ta alloy) was found to improve coercivity without increasing the saturation magnetization. In particular, a coercivity of 1400 Oe was induced in a 400 Å film. In addition, linear bit densities from 8386 flux reversals/cm to 1063 flux reversals/cm (21300 fci to 28100 fci) were achieved at −3 dB, with a signal-to-noise (SNR) ratio of 30 dB. Moreover, corrosion resistance of CoCr and CoCrTa films was improved relative to CoNi films.

U.S. Pat. No. 4,940,548, issued on Aug. 21, 1990 to Furusawa, et al., and assigned to Hitachi, Ltd., discloses the use of Ta to increase the coercivity and corrosion resistance of CoCr (and CoNi) alloys. CoCr alloys with 10 at.% Ta (and chromium content between 5 and 25 at.%) were sputtered onto multiple layers of chromium to produce magnetic films with low modulation even without texturing the substrate surface and highly desirable crystalline microstructure and magnetic anisotropy.

Development of a high throughput in-line system to produce sputtered CoCrTa films with enhanced magnetic and corrosion-resistance properties for the magnetic recording media industry has obvious economic advantages.

Linear recording density of magnetic films on media used in Winchester-type hard disk drives is known to be enhanced by decreasing the flying height of the magnetic recording head above the recording medium. With reduced flying height, there is an increased need to protect the magnetic film layer from wear. Magnetic films are also susceptible to corrosion from vapors present even at trace concentrations within the magnetic recording system. A variety of films have been employed as protective overlayers for magnetic films, including rhodium, carbon and inorganic nonmetallic carbides, nitrides and oxides, like silica or alumina. However, problems such as poor adhesion to the magnetic layer and inadequate wear resistance have limited the applicability of these films. U.S. Pat. No. 4,503,125 issued on Mar. 3, 1985 to Nelson, et al. and assigned to Xebec, Inc. describes a protective carbon overcoating for magnetic films where adhesion is enhanced by chemically bonding a sputtered layer of titanium between the magnetic layer and the carbon overcoating.

In the particular case of sputtered carbon, desirable film properties have been achieved by carefully controlling deposition parameters. For example, during the sputtering process, the amount of gas incorporated in the growing film depends on sputtering parameters like target composition, sputtering gas pressure and chamber geometry. U.S. Pat. No. 4,839,244, issued on Jun. 13, 1989 to Y. Tsukamoto and assigned to NEC Corp., describes a process for co-sputtering a protective graphite fluoride overlayer with an inorganic nonmetallic compound in a gaseous atmosphere which includes fluorine gas. U.S. Pat. No. 4,891,114 issued on Jan. 1, 1990 to Hitzfeld, et al., and assigned to BASF Aktiengesellschaft of Germany, relates to a d. c. magnetron sputtering process for an amorphous carbon protective layer using a graphitic carbon target.

As the wear-resistant layer for magnetic recording media, it is desirable that the carbon overlayer have a microcrystalline structure corresponding to high hardness. In other words, it is desirable during sputtering to minimize graphitization of carbon which softens amorphous carbon films. One means employed to moderate graphitization of sputtered carbon films is by incorporating hydrogen into the film. Such incorporation may be accomplished by sputtering in an argon atmosphere mixed with hydrogen or a hydrogen-containing gas, such as methane or other hydrocarbons.

Magnetron sputtering processes have been developed which have been somewhat successful in achieving high throughput. For example, U.S. Pat. Nos. 4,735,840 and 4,894,133 issued to Hedgcoth on Apr. 5, 1988 and Apr. 16, 1990, respectively, describe a high volume planar d. c. magnetron in-line sputtering apparatus which forms multilayer magnetic recording films on disks for use in Winchester-type hard disk technology. The apparatus includes several consecutive regions for sputtering individual layers within a single sputtering chamber through which preheated disk substrates mounted on a pallet or other vertical carrier proceed at velocities up to about 10 mm/sec (1.97 ft/min), though averaging only about 3 mm/sec (0.6 ft/min). The first sputtering region deposits chromium (1,000 to 5,000 Å) on a circumferentially textured disk substrate. The next region deposits a layer (200 to 1,500 Å) of a magnetic alloy such as CoNi. Finally, a protective layer (200 to 800 Å) of a wear- and corrosion-resistant material such as amorphous carbon is deposited.

The apparatus is evacuated by mechanical and cryo pumps to a base pressure about $2 \times 10^{-7}$ Torr. Sputtering is performed at a relatively high argon pressure between 2 and $4 \times 10^{-2}$ Torr (20 to 40 microns) to eliminate anisotropy due to obliquely incident flux.

In optimizing a sputtering process to achieve high throughput, consideration should be given to other time-influenced aspects of the process apart from the sputtering rate. For example, substrate heating is typically accomplished with heaters requiring an extended dwell time to warm substrates to a desired equilibrium temperature. In addition, substrate transport speeds through the sputtering apparatus have been limited with respect to mechanisms using traditional bottom drive, gear/belt-driven transport systems. Such bottom drive systems generally have intermeshing gears and may be practically incapable of proceeding faster than a particular rate due to rough section-to-section transitions which may dislodge substrates from the carrier and/or create particulate matter from gear wear which contaminates the disks prior to or during the sputtering process. Thus, overall process throughput would be further enhanced by the employment of heating and transport elements which require minimal time to perform these functions.

Generally, prior art sputtering devices utilize relatively unsophisticated means for controlling the sputtering processes described therein. Such control systems may comprise standard optical or electrical metering monitored by a system operator, with direct electrical or electro-mechanical switching of components utilized in the system by the system operator. Such systems have been adequately successful for limited throughput of sputtered substrates. However, a more comprehensive system is required for higher throughput sputtering operations. Specifically, a control system is required which provides to the operator an extensive amount of information concerning the ongoing process through a relatively user-friendly environment. In addition, the control system must adequately automate functions both in series and in parallel where necessary to control every aspect of the sputtering system. Further, it is desirable to include within such a control system the capability to preset a whole series of operating parameters to facilitate rapid set-up of the system for processes employing myriad sputtering conditions.

SUMMARY OF THE INVENTION

Thus, an object of the present invention is to provide a high throughput sputtering process and apparatus.

A further object of the present invention is to provide a control system for the apparatus and process which continuously monitors and facilitates alteration of film deposition process parameters.

A further object of the present invention is to provide a high throughput sputtering apparatus with a centralized electronic control system.

An additional object of this invention is to provide the above objects in a means by which sputtering is achieved in a highly efficient, contaminant-free environment.

An additional object of this invention is to provide a highly versatile, contaminant-free means for transporting substrates through the apparatus and process.

A further object of this invention is to transport substrates through the sputtering apparatus by means of an overhead, gearless transport mechanism.

A further object of this invention is to provide a transport mechanism for carrying a plurality of substrates, each at a user-defined, variable speed.

A further object of this invention is to maintain a contaminant-free environment within the sputtering apparatus by means of a high speed, high capacity vacuum pump system.

A further object of this invention is to provide a magnetron design allowing efficient erosion of target material during the sputtering process.

A further object of this invention is to provide a high throughput sputtering apparatus which achieves and maintains a uniform substrate surface temperature profile before film deposition.

A further object of this invention is to provide a highly isotropic film by minimizing deposition by target atoms impinging on the substrate surface at high angles of incidence.

A further object of this invention is to provide high throughput sputtering apparatus which minimizes oxidation of the chromium underlayer before magnetic film deposition.

An additional object of the present invention is to provide high quality thin magnetic films on magnetic recording media with superior magnetic recording properties.

A further object of this invention is to provide high quality thin cobalt-chromium-tantalum (CoCrTa) films with superior magnetic recording properties.

A further object of this invention is to provide high quality sputtered thin magnetic films circumferentially oriented along the easy magnetic axis.

A further object of this invention is to provide high throughput sputtering apparatus for high quality thin carbon films with superior wear, hardness, corrosion and elastic properties.

A further object of this invention is to provide a method for depositing wear-resistant carbon films comprising sputtering in the presence of a hydrogen-containing gas.

A further object of this invention is to provide an improved method for sputtering carbon films using either an electrically biased or grounded pallet.

These and other objects of the invention are accomplished in a high throughput sputtering apparatus and process capable of producing sputtered substrates at a rate of up to five times greater than the prior art. An apparatus in accordance with the present invention provides a single or multi-layer coating to the surface of a plurality of substrates. Said apparatus includes a plurality of buffer and sputtering chambers, and an input end and an output end, wherein said substrates are transported through said chambers of said apparatus at varying rates of speed such that the rate of speed of a pallet from said input end to said output end is a constant for each of said plurality of pallets. A high throughput sputtering apparatus having a plurality of integrally matched components in accordance with the present invention may comprise means for sputtering a multi-layer coating onto a plurality of substrates, said means for sputtering including a series of sputtering chambers each having relative isolation from adjacent chambers to reduce cross contamination between the coating components being sputtered onto substrates therein, said sputtering chambers being isolated from ambient atmospheric conditions; means for transporting said plurality of substrates through said means for sputtering at variable velocities; means for reducing the ambient pressure within said means for sputtering to a vacuum level within a pressure range sufficient to enable sputtering operation; means for heating said plurality of substrates to a temperature conducive to sputtering said multi-layer coatings thereon, said means for heating providing a substantially uniform temperature profile over the surface of said substrate; and control means for providing control signals to and for receiving feedback input from, said means for sputtering, means for transporting, means for reducing and means for heating, said control means being programmable for allowing control over said means for sputtering, means for transporting, means for reducing and means for heating.

A process in accordance the present invention includes: providing substrates to be sputtered; creating an environment about said substrates, said environment having a pressure within a pressure range which would enable sputtering operations; providing a gas into said environment in a plasma state and within said pressure range to carry out sputtering operations; transporting substrates at varying velocities through said environment a sequence of sputtering steps within said environment and along a return path external to said environment simultaneously introducing the substrates into said environment without substantially disrupting said pressure of said environment, providing rapid and uniform heating of said substrates to optimize film integrity during sputtering steps, and sputtering said substrates to provide successive layers of thin films on the substrates; and, removing the sputtered substrates without contaminating said environment.

BRIEF DESCRIPTION OF THE DRAWINGS

The invention will be better understood by reference to the figures of the drawings wherein like numbers denote like parts throughout and wherein:

FIG. 9 is a partial, enlarged view of the pallet of FIG. 8.

FIG. 10 is a partial, enlarged view of one region for carrying a disk in the pallet of FIG. 9.

FIG. 11 is a cross sectional view along 11—11 of the disk carrying region shown in FIG. 10.

FIG. 12 is an overview diagram of the pumping system used with the apparatus of the present invention.

FIG. 15 is a cross sectional view of the main (or "dwell") heating lamp assembly and chamber.

FIG. 16 is a view of the main heating lamp assembly along line 16—16 in FIG. 15.

FIG. 18 is a cross sectional view of the secondary (or "passby") heating lamp and chamber assembly.

FIG. 19 is a view of the heating lamp assembly along line 19—19 in FIG. 18.

FIG. 20 is a view of the secondary heating lamp, mounting tray and cooling lines along line 20—20 in FIG. 18.

FIG. 25 is a partial perspective view of a first surface of the cathode portion of the magnetron of the present invention.

FIG. 26 is a perspective view of a second surface of the cathode of the magnetron of the present invention, including cooling line inputs and magnet channels of the cathode.

FIG. 27A is a cross-sectional, assembled view of a first embodiment of the magnet configuration in the cathode for a nonmagnetic target of the present invention along line 27—27 of FIG. 25.

FIG. 27B is a cross-sectional, assembled views of a second embodiment of the magnet configuration in the cathode for magnetic target of the present invention along line 27—27 of FIG. 25.

FIG. 30 is a block flow chart of functional aspects of the software utilized in the process controller(s) of the present invention.

FIG. 31 is a flow chart of the automated cryogenic pump regeneration process of the present invention.

DESCRIPTION OF THE PREFERRED EMBODIMENT

A. Introduction

Described herein is an apparatus and method for applying multilayer thin films to a substrate. The apparatus of the present invention is capable of applying the multilayer coatings to any given substrate within a time frame of approximately five minutes. The apparatus and process may provide production throughputs on the order of at least five times greater than those of prior art multi-layer coating processes.

Other advantages of the sputtering apparatus and method for high throughput sputtering include: flexibility with respect to the composition of the multilayer films applied and the types of substrates to which they are applied; easily interchanged coating components; a novel means for heating substrates; a novel sputtering magnetron design; a variable speed, overhead, noncontaminating substrate transportation system; and a comprehensive, centralized, programmable electronic means for controlling the apparatus and process. In addition, when the process and apparatus are used for providing magnetic coatings for substrates, such as disks, to be utilized in hard disk drives using Winchester-type technology, also disclosed herein are: a unique disk texturing method for improving the disk's magnetic recording properties, and a novel disk carrier (or pallet) design which contributes to uniform substrate heating characteristics in a large, single, high capacity pallet.

The high throughput process and apparatus of the present invention accomplishes the objectives of the invention and provides the above advantages by providing a comprehensive in-line sputtering system utilizing matched component elements to process multiple large single sheet or pallet transported discrete substrates in a continuous, variable speed, sputtering process wherein each substrate has a start-to-finish process time which is relatively constant. Such an apparatus and method can process up to 3,000 95 mm disk substrates, and 5,300 65 mm disk substrates, per hour. In the disk drive industry where cost savings per disk on the order of a few cents are a distinct advantage, the system manufactures 95 mm disk substrates at a cost of $8.00 per disk as opposed to $12.00 per disk for other sputtering apparatus. Crucial to this process and apparatus are matching and optimizing such elements as disk preparation, including texturing and cleaning, provision of a sputtering environment with a sputtering apparatus, through an optimal vacuum pump system, transporting disk substrates through the sputtering environment in a high volume, high speed, contaminant-free manner without disturbing the sputtering environment, heating the substrates within the environment to optimal thermal levels for sputtering, and sputtering the substrates through a series of substantially isolated, non-crosscontaminating sputtering steps.

Figure 4:
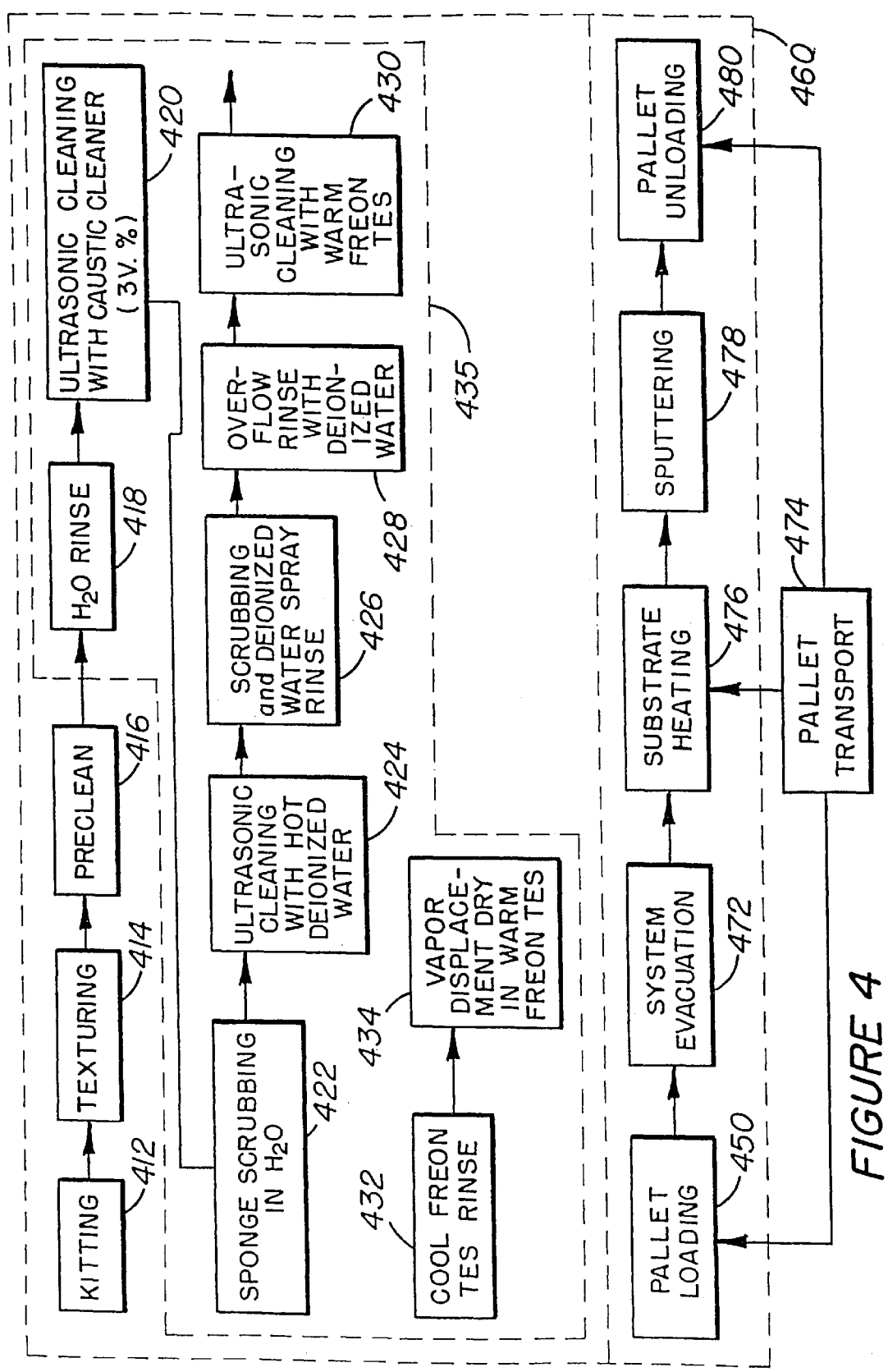
FIG. 4 is an overview block diagram of the sputtering process of the present invention.
Figure 5:
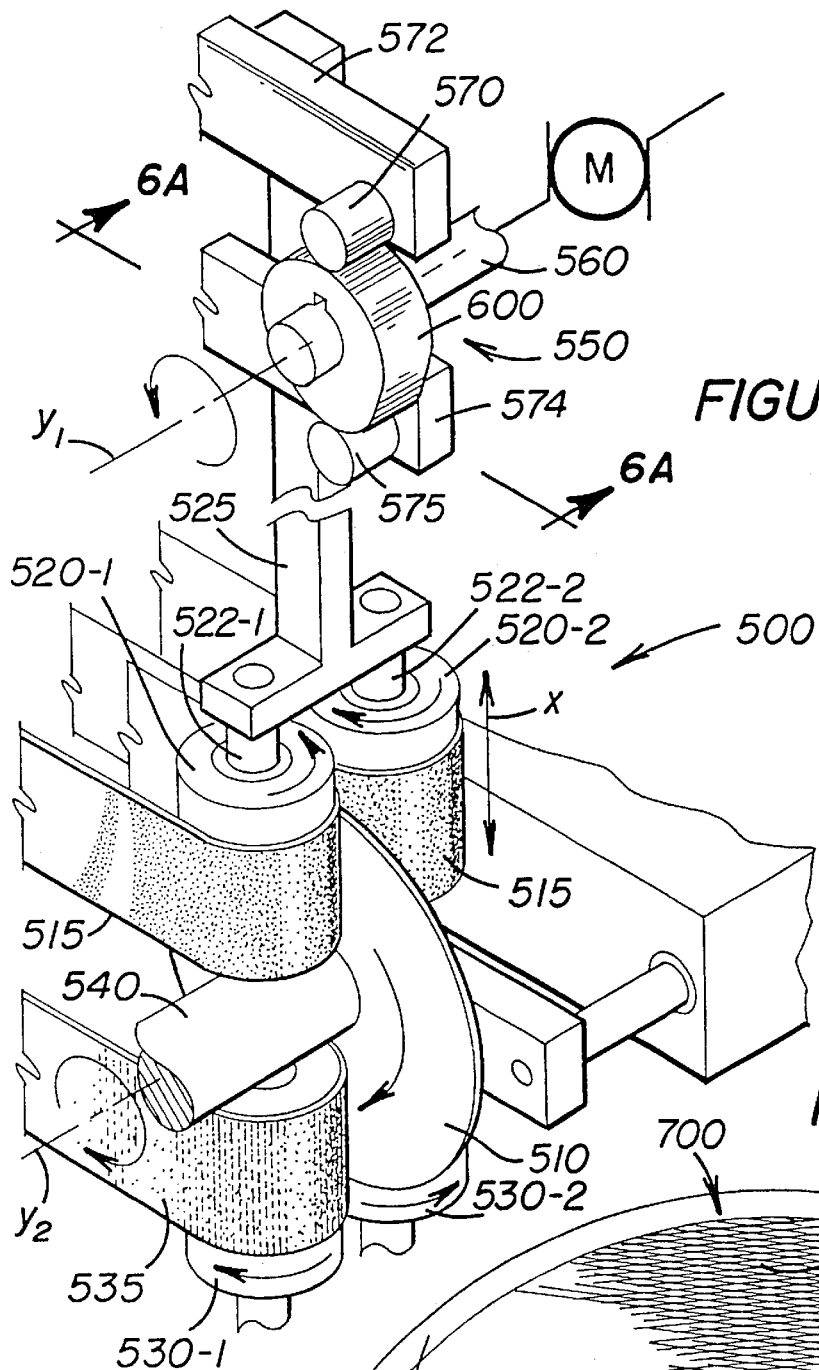
FIG. 5 is a simplified perspective view of the means for texturing disk substrates used in the process of the present invention.
Figure 7:
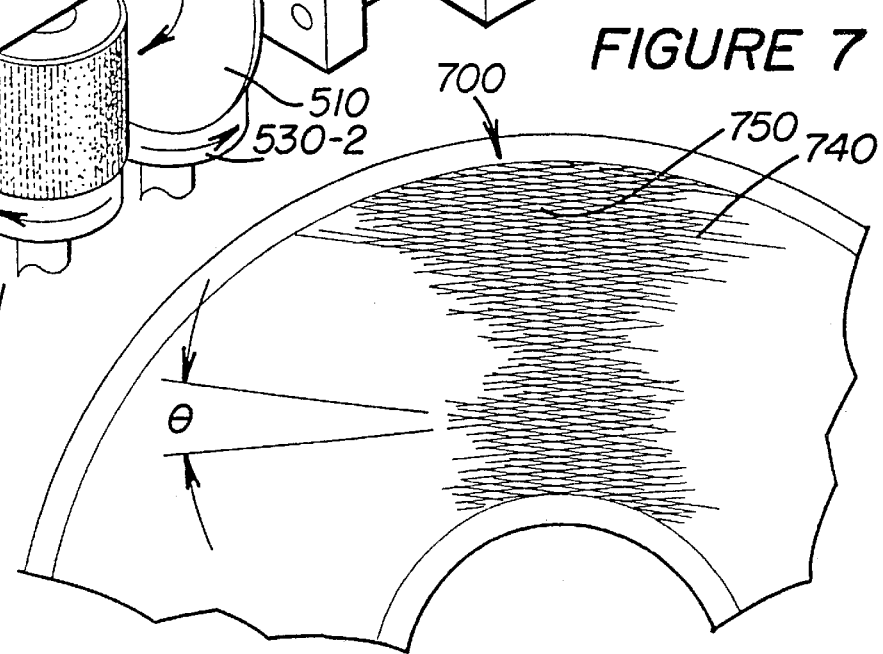
FIG. 7 is a sectional magnified view of the texturing of a disk surface provided by the means for texturing disclosed in FIG. 5.
Figure 6A:
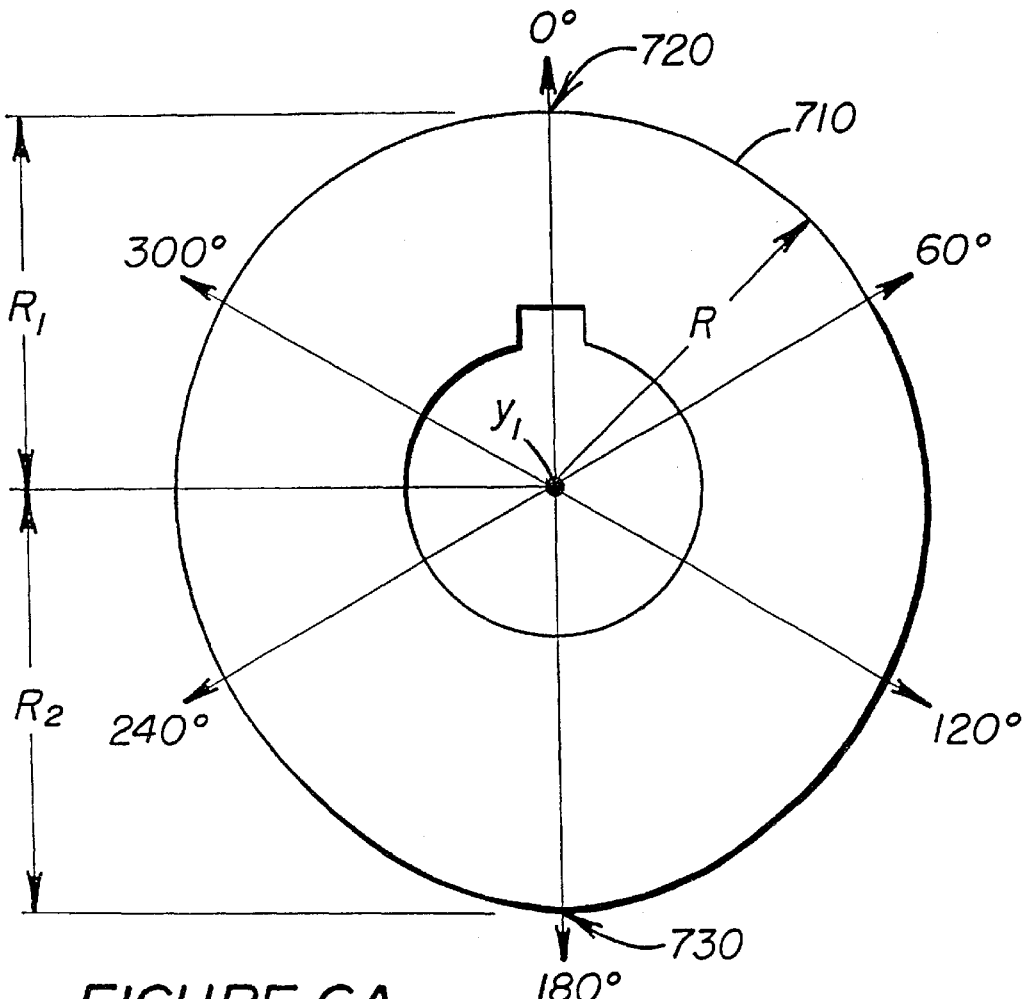
FIGS. 6A and 6B are cross sectional views along line 6—6 of the cam wheel utilized in the means for texturing shown in FIG. 5.
Figure 6B:
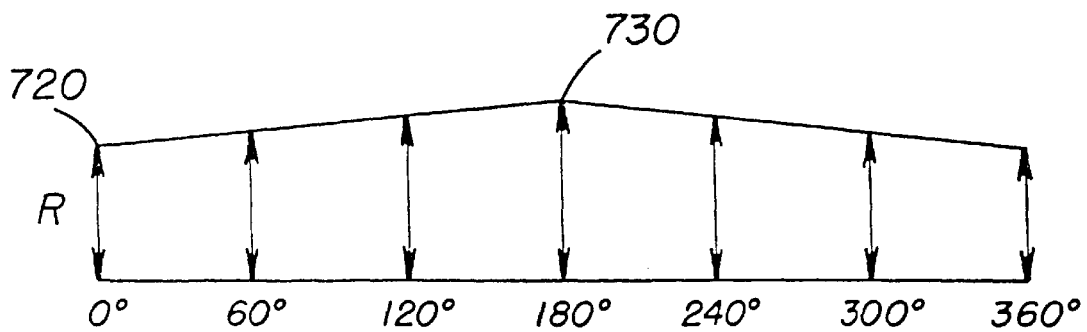
Figure 8:
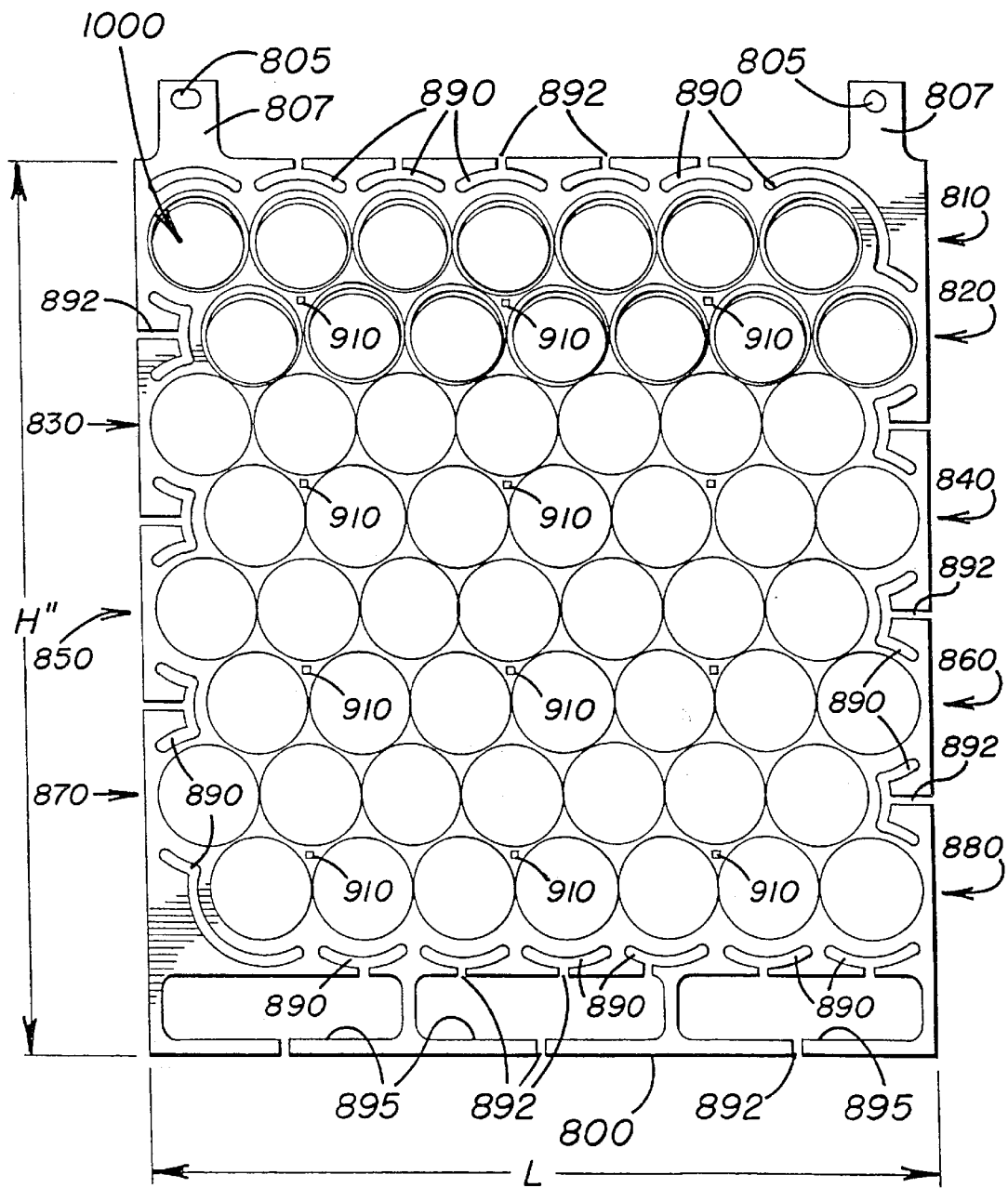
FIG. 8 is a surface view of one embodiment of a pallet for carrying disks through the sputtering apparatus of the present invention.
Figure 13:
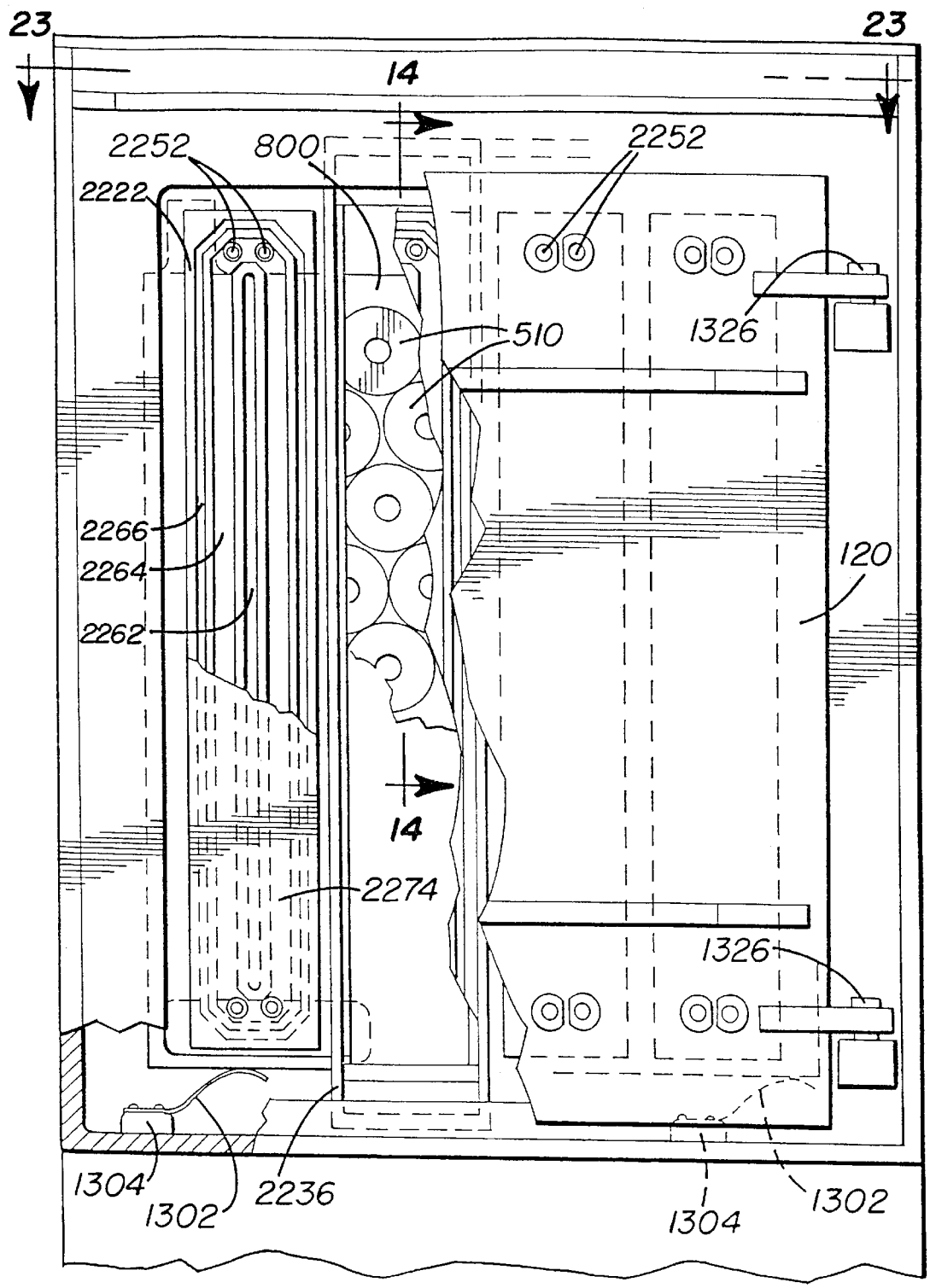
FIG. 13 is a side, partial cutaway view of a sputtering chamber utilized in the apparatus of the present invention.

In general, application of multilayer films to a substrate involves two basic steps: preparation of the substrate and film deposition. FIG. 4 represents a general overview of the process for applying thin films to a disk substrate according to the present invention. In particular, FIG. 4 outlines the process steps for providing a single or multilayer film on a substrate, for example, a nickel-phosphorus plated aluminum disk for use in Winchester-type hard disk drives. It will be recognized by those skilled in the art that the steps outlined in FIG. 4 may be modified, as required, depending on the particular type of substrate to be coated or thin film to be applied.

Substrate preparation process 410 of FIG. 4 includes: kitting process 412; disk texturing process 414, disk pre-cleaning 416; water rinse 418; ultrasonic cleaning with caustic cleaner 420; a sponge scrubbing in water 422; an ultrasonic cleaning in hot deionized water 424; scrubbing and deionizing water spray rinse 426; overflow deionized water rinse 428; ultrasonic cleaning of the disks with warm FREON TES 430; a cool FREON TES rinse 432; and vapor displacement drying in warm FREON TES 434.

Subsequent to the substrate preparation process 410, the clean, dry disk substrates may be provided to pallet loading process 450, wherein the disk substrates are provided to a substrate carrier which transports the disk substrates through coating process 460.

Figure 1:
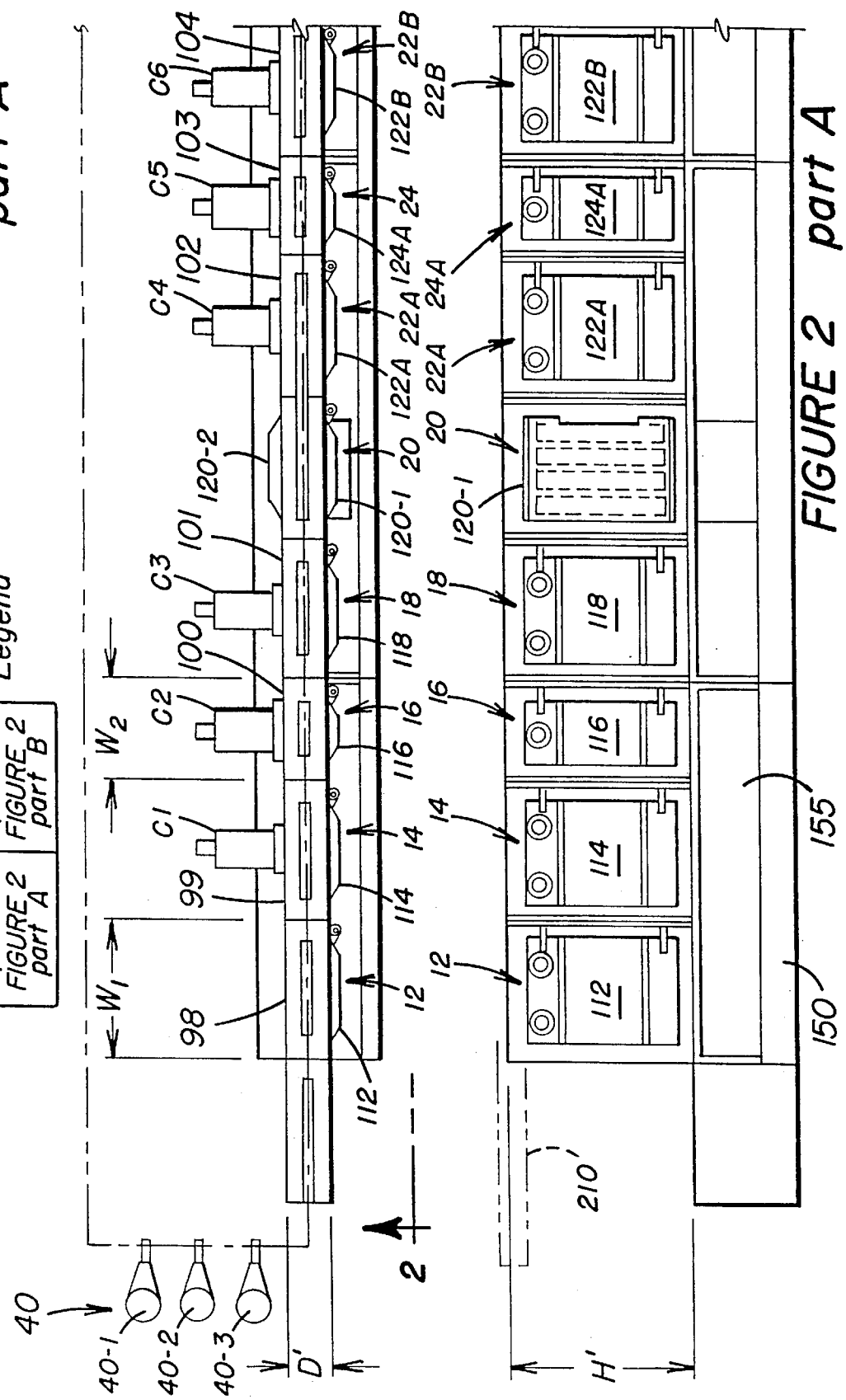
FIG. 1 is a system plan view of the sputtering apparatus of the present invention.
Figure 2:
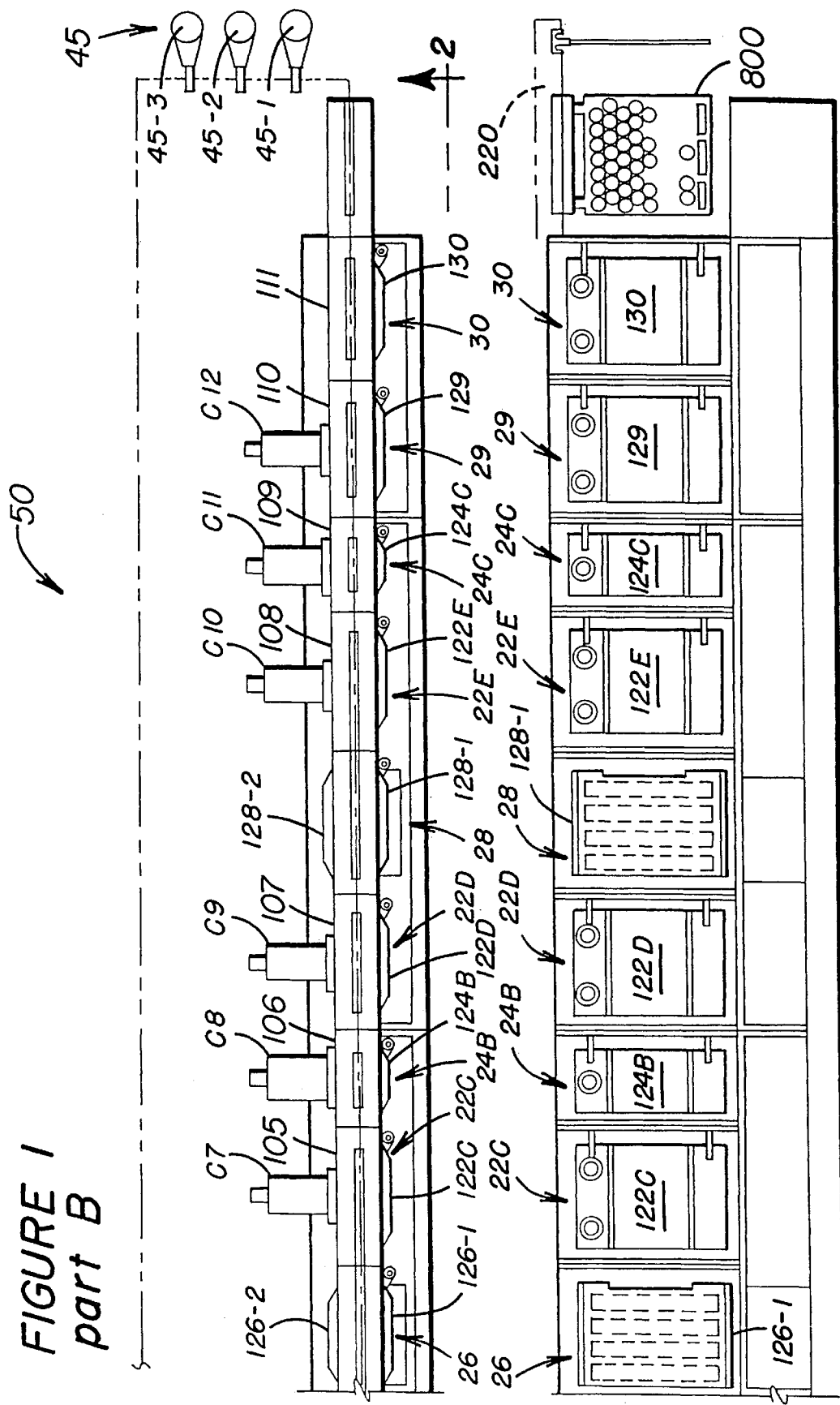
FIG. 2 is a cross sectional view along line 2—2 of the sputtering apparatus of the present invention as shown in FIG. 1.
Figure 3:
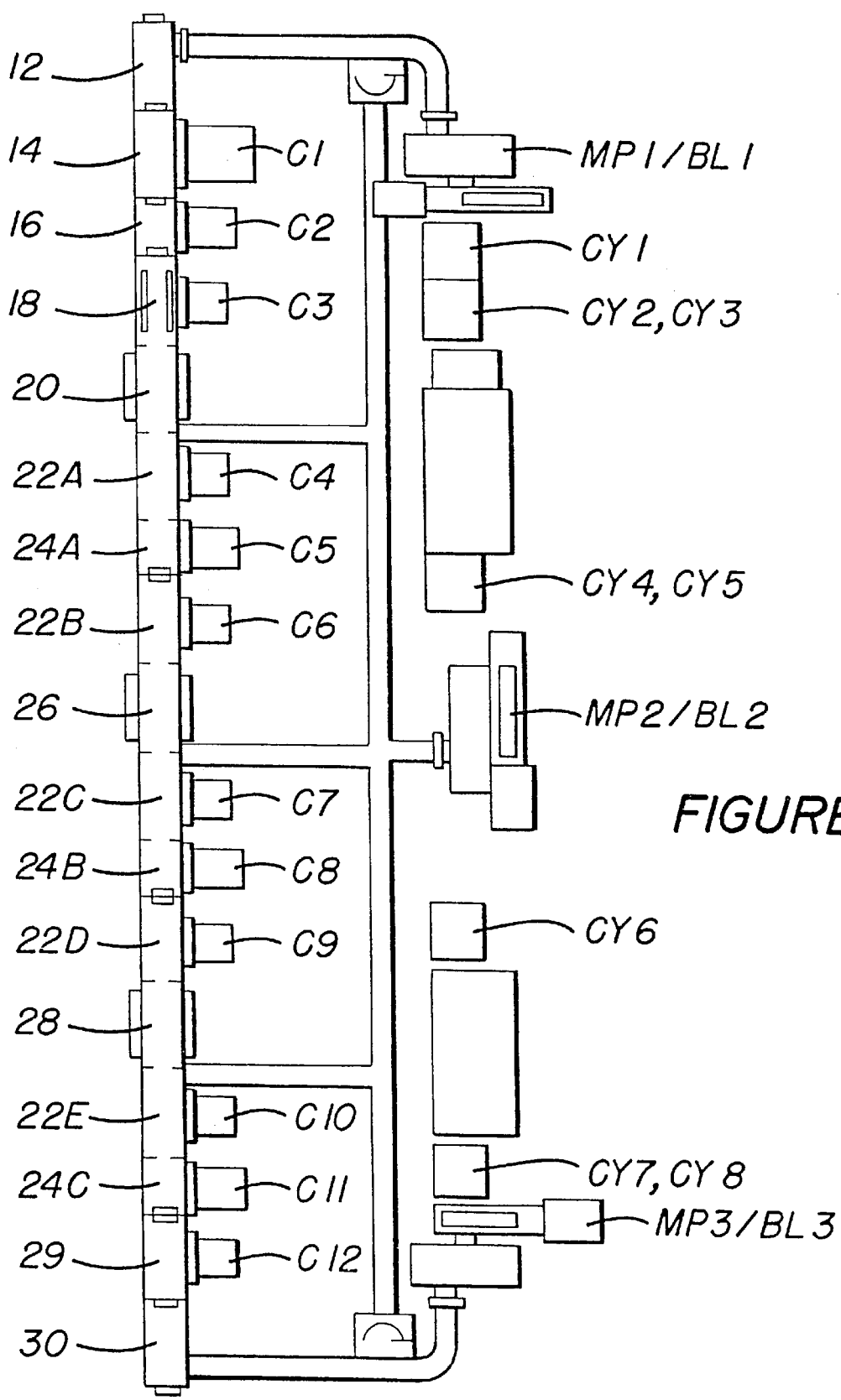
FIG. 3 is a plan view of the sputtering apparatus of the present invention illustrating the physical relationship of the power supply and pumping subsystem components.

In coating process 460, disk substrates are provided to a coating apparatus, such as sputtering apparatus 10 shown in FIGS. 1 and 2, for provision of single or multilayer film thereon. The steps involved in coating process 460, such as in, for example, sputtering apparatus 10 of the present invention, involve: a system evacuation process 472 wherein specific chambers of the sputtering system are evacuated to a pressure of approximately $10^{-7}$ Torr and backfilled with a suitable sputtering gas, such as argon; a substrate heating process 476, wherein the substrates are raised to a temperature conducive to optimal film deposition; and a sputtering process 478 wherein the films are deposited on the substrates. Subsequently, the substrates are provided to an unload process 480. A process for transporting pallets 474 provides means for transporting the substrates through the above processes.

Each of the aforementioned steps with respect to applying the multilayer films to the substrates is discussed below in detail in separate sections of this specification.

B. Sputtering Apparatus Overview

Sputtering apparatus 10, used to apply a single or multi-layer film to one or more substrates, will be discussed generally with reference to FIGS. 1A, 1B, 2A, 2B, and 3. Sputtering apparatus 10 provides a high throughput, in-line, magnetron sputtering process which allows reduced manufacturing costs per substrate by performing the coating sequence in a high volume manner. As will be discussed in detail below, single or multilayer film can be applied to a single side, or both sides, individually or simultaneously, of a single large sheet substrate, or to discrete substrates, such as disks mounted in a rack, pallet or other substrate carrier.

Generally, substrates are provided through multiple sputtering chambers 20, 26, 28 in apparatus 10 at a rate of speed, such as 3–6 feet/minute, and through heater chambers 14,16 and buffer chambers 12, 18, 22A–E, 24A–24C, 29 and 30, at a second rate of speed, such as 12 feet/minute. Through carefully matched elements, each of the substrates has a constant speed through apparatus 10.

Sputtering apparatus 10 includes seventeen (17) chamber modules 12–30 generally comprised of two basic types. A first type is configured for use as lock modules (12, 30), deposition process modules (20, 26, 28) or dwell modules (14, 18, 22A–22D and 29). A second type of module is configured for use as high vacuum buffer modules (16, 24A–24C) to provide process separation between deposition modules as discussed below.

Also shown in FIGS. 1 and 2 is substrate carrier return path 50 of the transport system of the present invention. Preferably, return path 50 is provided to allow an ample number of substrate carriers to return from exit lock 30 for reuse in sputtering apparatus 10 in a continuous process, thereby reducing production delays and increasing overall process production speed. In addition, FIGS. 1 and 2 illustrate robotic pallet loading station 40 and robotic pallet unloading station 45, arranged along the transport system return path 50, for automatic loading and unloading, respectively, of the disk substrates into racks or pallets. As discussed in detail below, the substrate transport system utilizes a plurality of individual transport beam platforms, each including one or more optical or proximity position sensors, to move substrates through sputtering apparatus 10 and along return path 50, and to monitor the position of each substrate carrier within the transport system. Transfer speeds of the substrate carriers throughout the transport system may be adjustably varied from 0 to 24 ft/min. It should be noted that the upper limit of substrate carrier transport speed is constrained by the process limits of sputtering apparatus 10. Each individual drive stage is identical and thus has identical upper and lower speed limits.

Twelve (12) pneumatically operated doors D1–D12 are placed between specific chamber modules 12–30 of sputtering apparatus 10. Doors D1–D12 are located as generally represented in FIG. 12 and are positioned as follows: door D1 isolates chamber 12 from the ambient environment; door D2 isolates load lock chamber 12 from main ("dwell") heating chamber 14; door D3 isolates main heating chamber 14 from first buffer-passby heating chamber 16; door D4 isolates buffer chamber 16 from first dwell chamber 18; doors D5–D6 isolate second buffer chamber 24A from third dwell chamber 22B; doors D7–D8 isolate third buffer chamber 24B from fifth dwell chamber 22D; doors D9–D10 isolate fourth buffer chamber 24C from exit buffer 29; door D11 isolates exit buffer chamber 29 from exit lock chamber 30; and door D12 isolates exit lock chamber 30 from the ambient environment.

With reference to FIGS. 1–3 and 12, the general arrangement of chamber modules 12–30 will be hereinafter discussed. Load lock chamber 12 is essentially an isolation chamber between the ambient environment and chambers 14–29 of sputtering apparatus 10. Load lock chamber 12 is repeatedly evacuated between a pressure of approximately 50 mTorr and vented to ambient atmospheric conditions. Generally, sputtering within apparatus 10 takes place in an evacuated environment and chambers 16–29 are evacuated to the pressure of approximately $10^{-7}$ Torr, before argon gas is allowed to flow into the chambers to achieve a suitable sputtering pressure. Load lock chamber 12 is constructed of one-inch thick type 304 stainless steel and has a width $W_1$ of approximately 39 inches, length $L_1$ of approximately 49 inches, and a depth $D_1$ of approximately 12 inches as measured at the exterior walls of the chamber. The use of electropolished stainless steel in load lock chamber 12 and all other chambers in apparatus 10 minimizes particulate generation from scratches and other surface imperfections. Chambers 14, 18, 20, 22A–22D, 24A–24C, 26 and 28–30 have roughly the same dimensions. The internal volume of load lock chamber 12 is reduced to approximately three cubic feet by the installation therein of volume-displacing solid aluminum blocks bolted to the chamber door and rear wall (not shown) to facilitate faster evacuation times.

After door D1 is pneumatically operated to allow a single large substrate or pallet to enter load lock chamber 12 at the initiation of processing by sputtering apparatus 10, load lock chamber 12 will be evacuated to a pressure of 50 microns (50 mTorr). Chambers 16–29 will have been evacuated to a base pressure of about $10^{-7}$ Torr and then backfilled with argon to the sputtering pressure (approximately 9–12 mTorr) prior to the entrance of a substrate into load lock chamber 12. Chamber 14 will have been evacuated previously to a pressure of approximately $10^{-5}$–10/–7 Torr. Load lock chamber 12 is thus mechanically evacuated and pressurized at a level intermediate to that of chambers 14–29, and external ambient pressures, to provide isolation for the downstream sputtering processes occurring in chambers 14–29.

Dwell heating chamber 14 serves two functions: it acts as an entrance buffer between load lock chamber 12 and the internal sputtering environment in chambers 16–29; and it serves as a heating chamber for increasing the substrate temperature to optimize film deposition. Chamber 14 includes eight banks of quartz lamp heating elements, four banks mounted to outer door 114 and four banks mounted opposite thereof on rear chamber wall 99. Door D2, separating load lock chamber 12 and dwell heating chamber 14, is a high vacuum slit valve.

During processing of a substrate, dwell heating chamber 14 is pumped to a pressure of approximately $10^{-5}$–$10^{-7}$ Torr before the substrate present in load lock chamber 12 is allowed to pass into dwell heating chamber 14. A pressure of $10^{-5}$–$10^{-7}$ Torr helps eliminate the effects of outgassing from the substrate in dwell heating chamber 14. Subsequently argon backfilling is provided to raise the pressure to approximately 9–12 mTorr, equalizing the environment in dwell heating chamber 14 with that in chambers 16–29. The substrate may thereafter remain in dwell heating chamber 14 for the duration of time necessary for the exposure of the substrate to the lamps to have its desired effect.

First buffer passby heating chamber 16 is a chamber module of the second type having a width $W_2$ of approximately 26 inches by a height H' of approximately 49 inches by a depth D' of approximately 12 inches. In general, buffer chambers 16 and 24A–C are positioned between dwell chambers 18A and 22A–D to separate the ongoing sputtering processes within apparatus 10, thereby reducing cross-contamination of coating components.

First buffer-passby heating chamber 16 includes a heating assembly comprising ten banks of quartz lamp heating elements, five mounted to outer door 116 and five to the rear chamber 100 wall opposite thereof. Passby heating chamber 16 is designed to insure uniform substrate temperature prior to film deposition.

Three coating modules—chromium deposition chamber 20, magnetic deposition chamber 26, and carbon deposition chamber 28—having dimensions roughly equal to those of load lock chamber 12 and constructed of type 304 electropolished stainless steel, may be utilized to sputter single or multilayer films on a substrate passing through apparatus 10. Four pairs of d. c. magnetron sputtering cathodes are mounted, four magnetrons per door, on doors 120-1, 120-2, 126-1, 126-2, 128-1, and 128-2 on both sides of each chamber 20, 26, and 28, respectively. Target materials are mounted to cathodes 2222–2225. Anodes 2338, gas manifolds 2323, and shielding 2230, 2236, 2238 and 2240 are also attached to outer doors 120-1, 120-2, 126-1, 126-2 and 128-1, 128-2. Mounting these components to the doors facilitates target changes and chamber maintenance. Further, conduits (not shown) for power, cooling, and process gases are provided in outer doors 120, 126, 128. Feedthrough conduits are also provided in doors 112, 114, 116, 118, 122A–122E, 124A–124C, 129, and 130 to allow for modification of the sputtering apparatus 10. Details of deposition chambers 20, 26 and 28 are provided in Section I of this specification.

Dwell chambers 18 and 22A–22E are manufactured to have the same dimensions as load lock chamber 12 and provide separation between the buffer modules and the deposition chambers. Dwell modules 18 and 22A–22E allow for substrate transport system runout, if necessary, during multiple substrate processing in sputtering apparatus 10. If desired, additional heating assemblies may be provided in any or all of dwell modules 22A–22E.

Exit buffer module 29 is essentially identical to dwell heating chamber 14, without the dwell heating assembly hardware. Exit buffer module 29 provides a buffer area to facilitate removal of pallets or substrates from sputtering apparatus 10 to exit lock chamber 30 and further isolates the sputtering process from the external environment.

Exit lock chamber 30 is essentially identical to load lock chamber 12 and operates in reverse pumping order, allowing pallets or substrates to be transferred from the evacuated environment of sputtering apparatus 10, to the ambient external environment.

Optimally, sputtering apparatus 10 can simultaneously process up to seven large single sheet substrates or pallets carrying smaller substrates, such as disks. When seven such substrates are simultaneously processed in sputtering apparatus 10, one such substrate is positioned in each of seven chambers, for example, as follows: load lock chamber 12; dwell heating chamber 14; chromium deposition chamber 20; magnetic deposition chamber 26; carbon deposition chamber 28; exit buffer chamber 29; and exit lock chamber 30. The sheer dimensions of sputtering apparatus 10 allow for a plurality of large single sheet substrates, and a plurality of high capacity discrete substrate carrying pallets, or both, to be simultaneously processed. The problems attending the development of such a large scale, high throughput sputtering apparatus, and the solutions adopted, are discussed herein.

Chambers 12–30 are mounted on steel assembly rack 150. Rack 150 includes channels 55 which preferably are used to mount components used with sputtering apparatus 10, such as those used in the electronic control system. It will be understood by those skilled in the art that any suitable arrangement for mounting chambers 12–30 may be made within contemplation of the present invention.

I. Sputtering Chambers in General

As shown in FIGS. 1 and 2, the present invention includes three in-line sputtering chambers 20, 26, and 28 to deposit a multilayer film, including chromium, CoCrTa and carbon thin films, respectively. Those skilled in the art will recognize that the application of the following principles to design a sputtering apparatus with greater or fewer sputtering chambers or with the capability to deposit more or fewer films is within the contemplation of the present invention. Moreover, all of the sputtering chambers within a particular sputtering apparatus need not be devoted to sputtering films. Indeed, any given sputtering chamber may participate in the overall process solely to the extent of serving as a pressurized inert passageway for substrates.

The following description relates to the internal configuration of each sputtering chamber, which is symmetrical about the line of pallet travel through the sputtering apparatus 10. FIGS. 13, 14 and 23 through 28 illustrate various aspects of the sputtering chambers and will be referred to as necessary.

Referring to FIGS. 13, 14, 22 and 23, sputtering chamber 20 generally represents the internal configuration of sputtering chambers 20, 26 and 28. By way of explanation, only chromium sputtering chamber 20 will be hereafter described. Only one-half of the chamber is described with the understanding that the description applies to both halves.

Four planar (rectangular) cathodes 2222, 2223, 2224 and 2225 are mounted through insulative layer 121 to door 120. Door 120 is rotatable about hinge 1326 to allow access to the interior of chromium sputtering chamber 20, for example, for maintenance purposes. Interlocked protective cover 2305 interrupts the power supply to chromium sputtering chamber 20 when door 120 is opened.

Cathodes 2222–2225 may be composed of a material such as copper and measure about 36 inches in length by 5½ inches in width by 1.125 inches thick. Cathodes 2222–2225 are provided with cooling lines 2552 to protect against overheating. Cooling lines 2552 supply a cooling fluid such as water along cooling conduits 2554 in cathode surface 2550.

Figure 14:
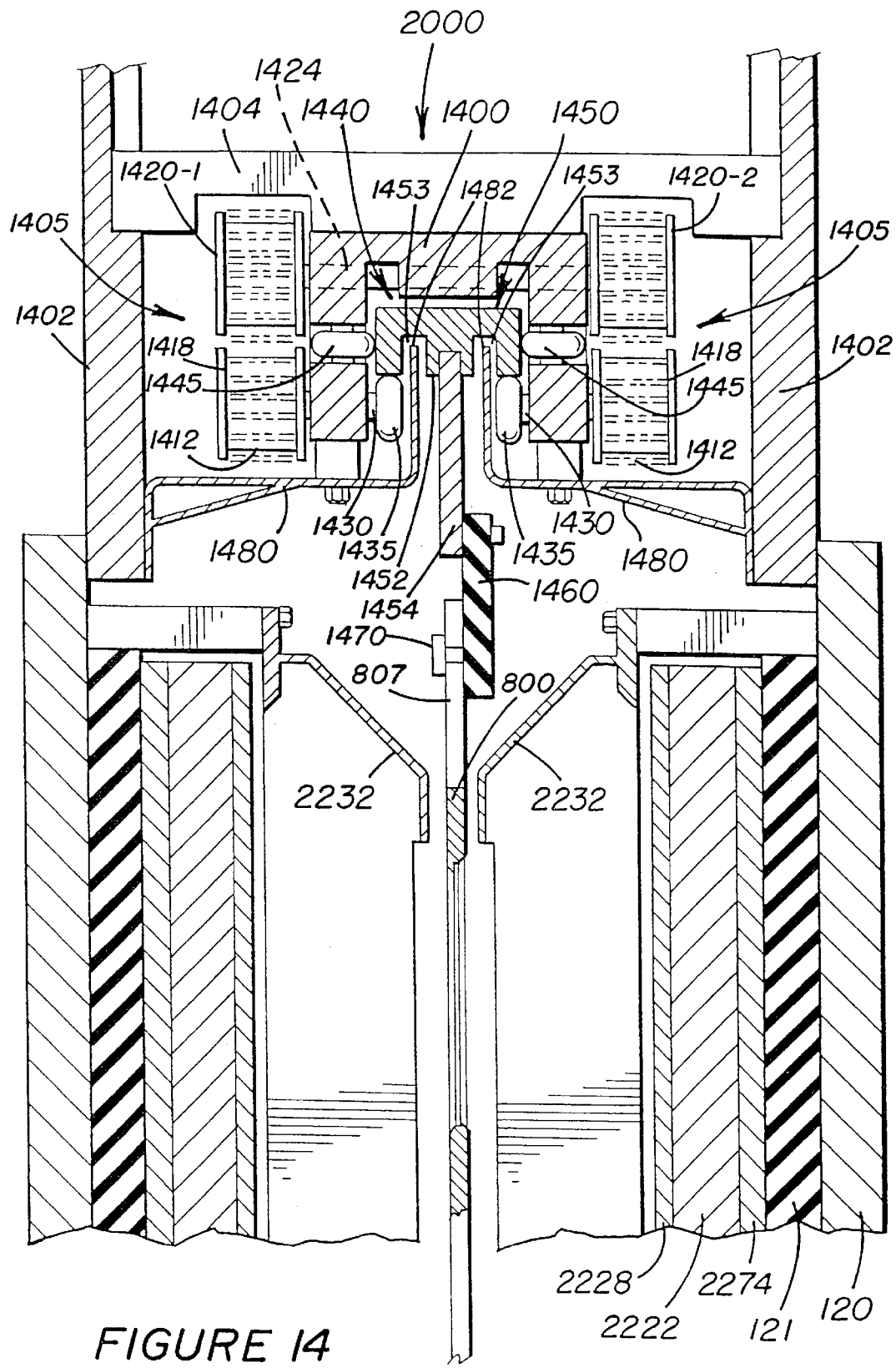
FIG. 14 is an assembled cross sectional view of the substrate transport mechanism, sputtering shields, and pallet viewed along line 14—14 of FIG. 13.
Figure 17:
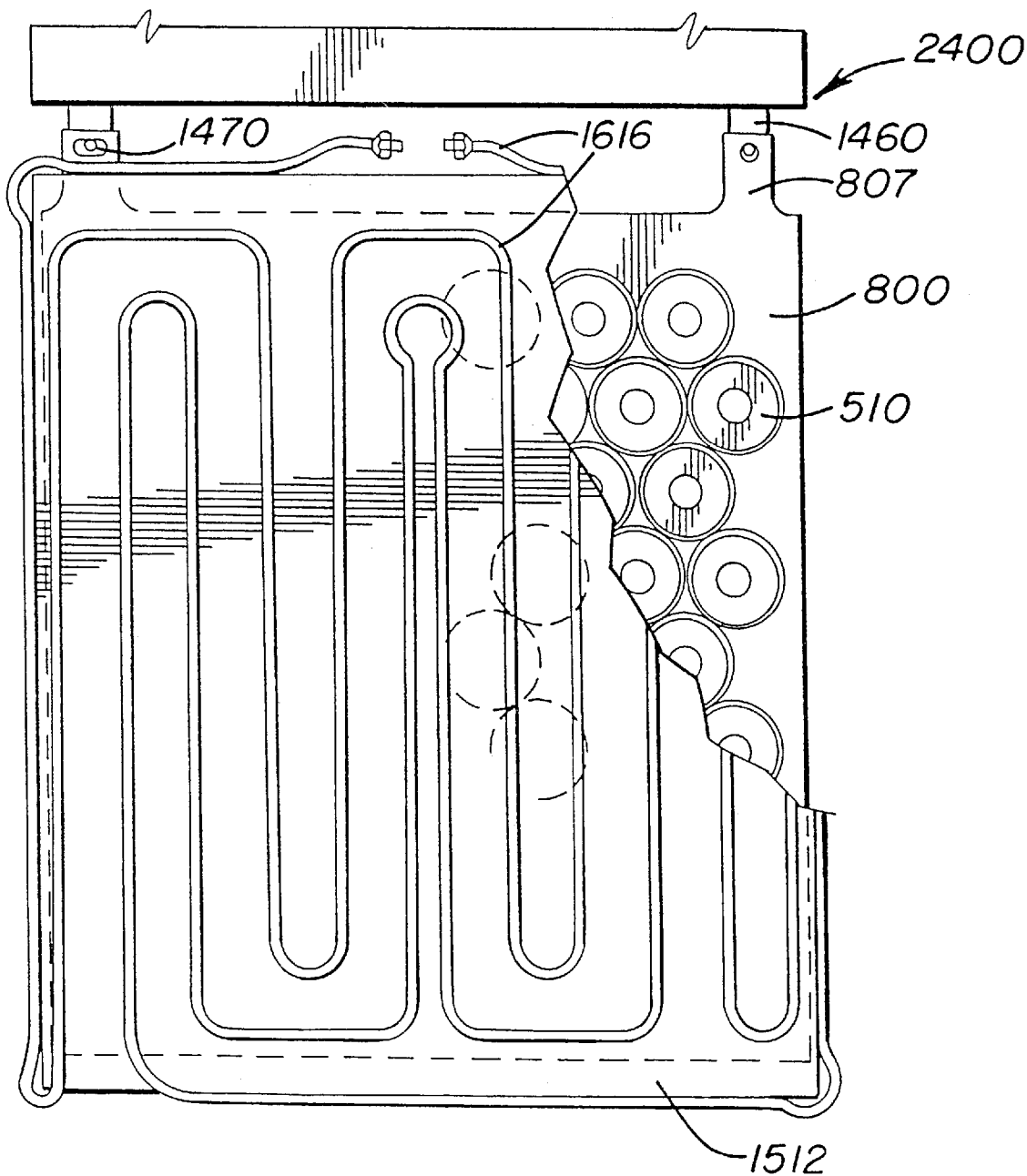
FIG. 17 is a view of the main heating lamp mounting tray and cooling lines along line 17—17 in FIG. 15.
Figure 21:
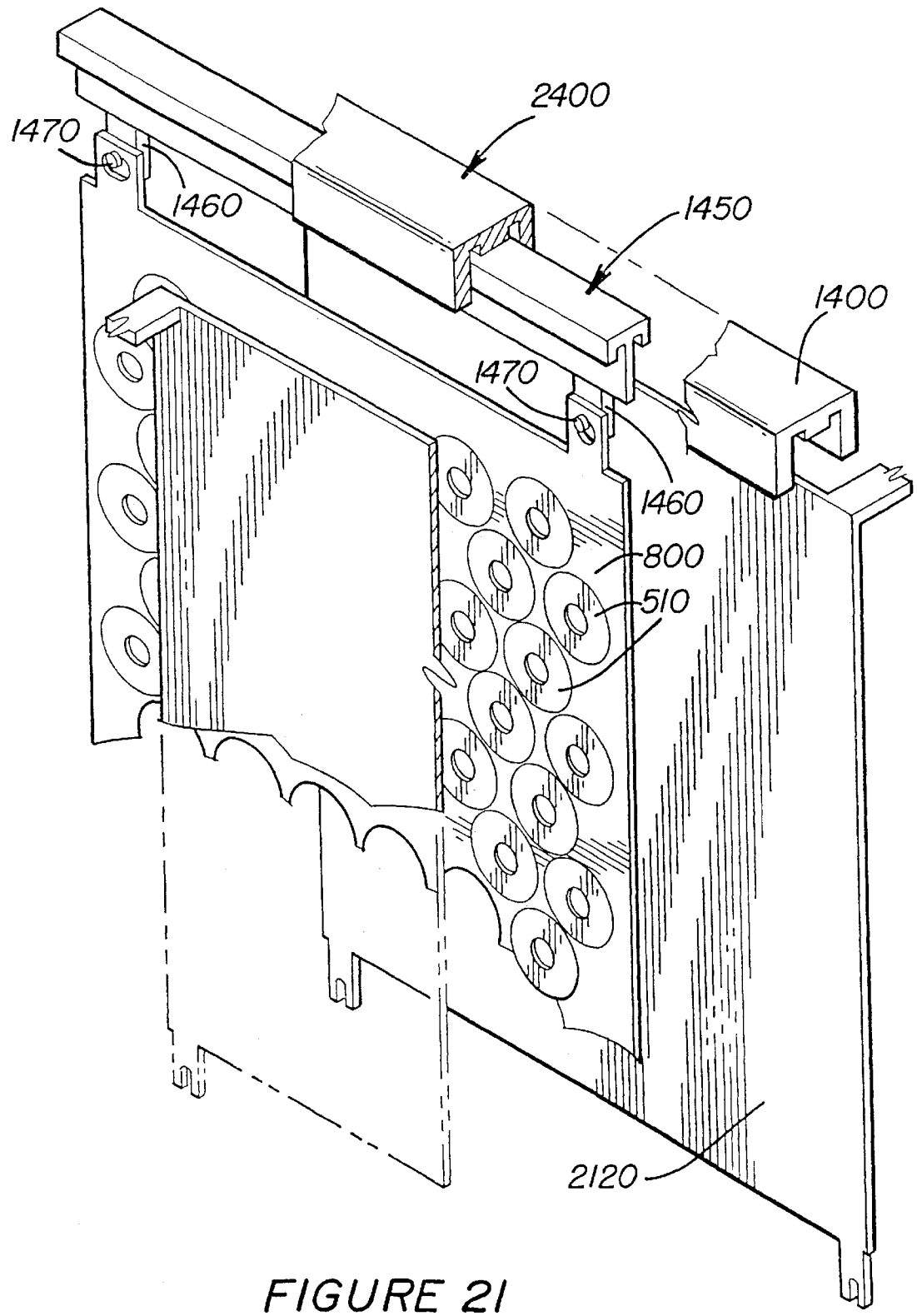
FIG. 21 is a perspective, partial view of a heat reflecting panel, pallet, and substrate transport system utilized in the apparatus present invention.
Figure 22:
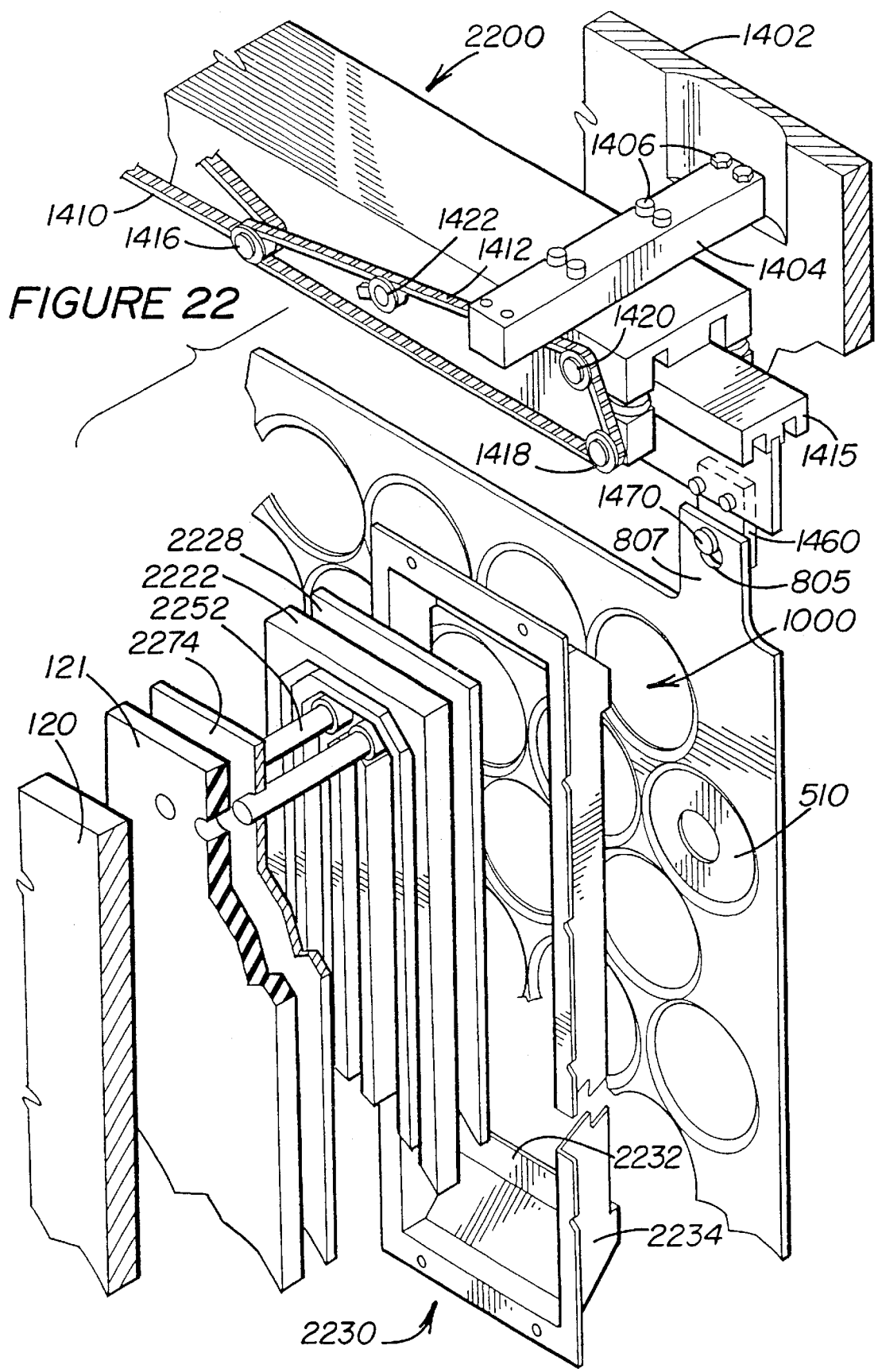
FIG. 22 is a perspective, exploded view of a portion of a pallet, substrate transport mechanism, sputtering shield, and cathode assembly utilized in the sputtering apparatus of the present invention.
Figure 23:
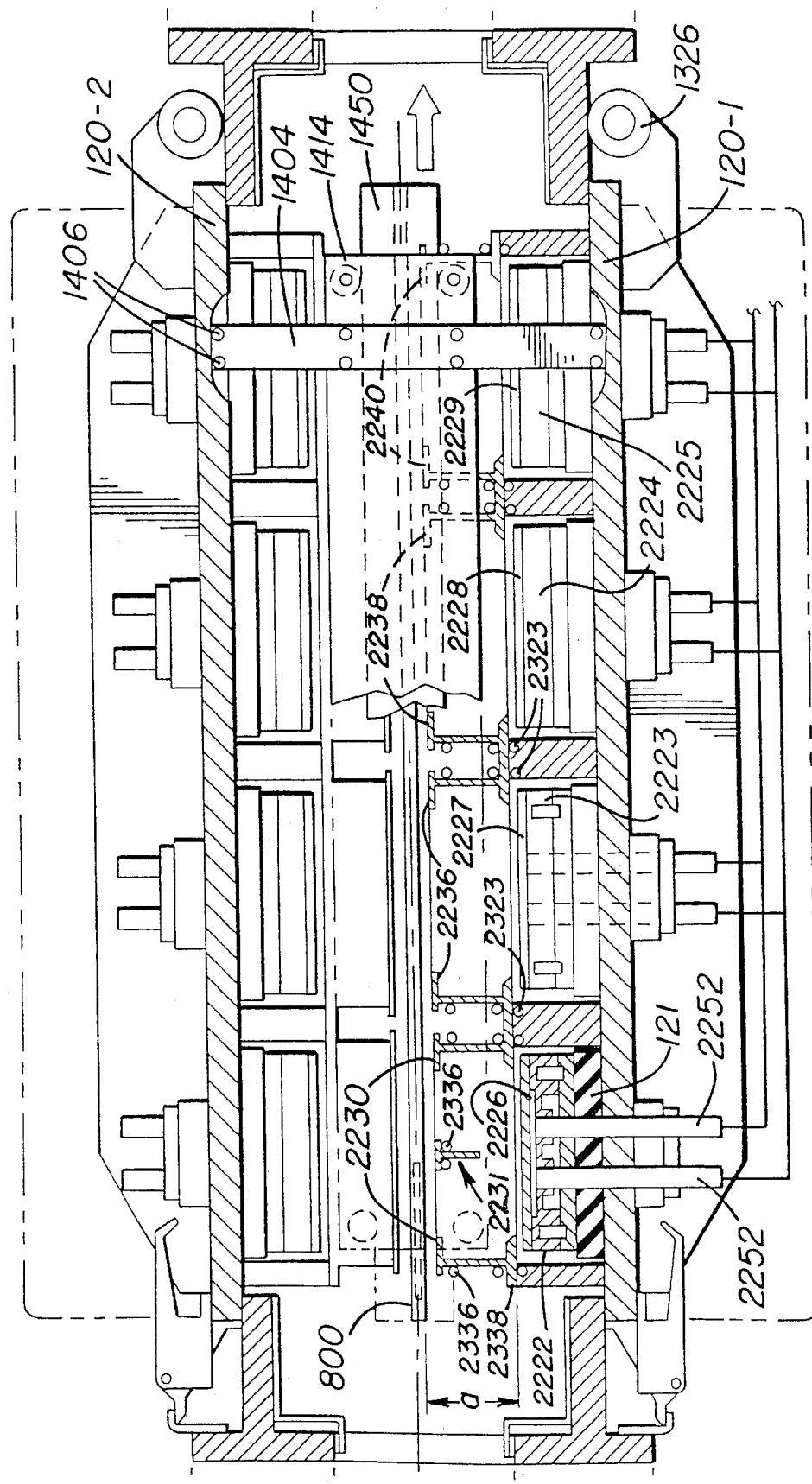
FIG. 23 is a top view of the sputtering chamber shown in FIG. 13.
Figure 24:
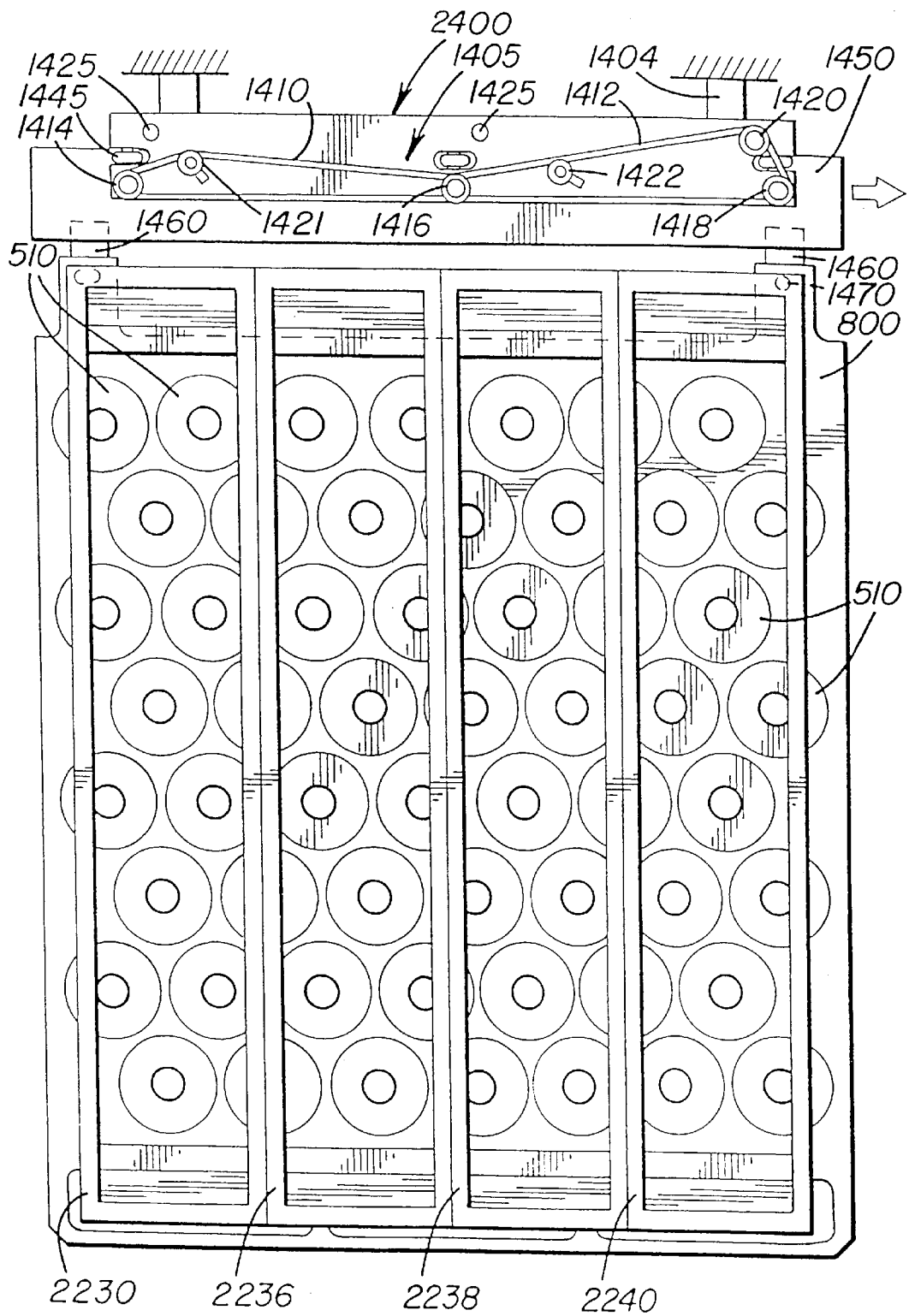
FIG. 24 is a cross-sectional, side view along line 24—24 of FIG. 23.

As illustrated in FIGS. 14, 22 and 23, targets 2226–2229 are mounted one per cathode 2222–2225, with the target being nearest the line of pallet travel through chromium sputtering chamber 20. Within any given sputtering chamber, the composition of all four targets depends upon the film to be deposited, but may be chromium, a magnetic alloy or carbon. Likewise, the thickness of the targets depends upon the type and the thickness of the film to be deposited. In the case of the chromium and magnetic sputtering chambers 20 and 26, the target-to-substrate distance 'a' is about 2¾ inches and the target-to-substrate distance 'a' for carbon targets is 2$^{11}$/$_{16}$ inches because the chromium and magnetic targets are thicker than the carbon target.

Referring now to FIGS. 21 through 24, shields 2230, 2236, 2238 and 2240 are mounted one per cathode 2222–2225. Shields 2230, 2236, 2238 and 2240 may be composed of a material such as copper and are generally rectangular in shape with peripheral flanges 2232 and 2234. Shield extension 2231 extends from shield 2230 into the chamber interior. Shields 2230, 2236, 2238 and 2240 are cooled by cooling lines 2336. A combined anode and dark space shield 2338 is incorporated into each shield 2230, 2236, 2238 and 2240.

The sputtering process occurs with the targets sputtering in a sideways fashion, depositing the desired film on each side of disk substrates 510 as pallet 800 proceeds through each sputtering chamber. As FIGS. 27A and 27B show, during sputtering, flux (represented by vectors A and B) leaves the target surface diffusely, depositing on the disk substrates and other surfaces within the sputtering chamber. As discussed previously, in-line sputtering of disk substrates can introduce undesirable magnetic anisotropies into the deposited film. Shields 2230, 2236, 2238 and 2240 intercept the obliquely incident flux (vector A) from targets 2226–2229 such that only flux substantially normal to the surface of target 2228 (vector B) is deposited on disk substrates 510. Specifically, peripheral flanges 2232 and 2234, extending the length of each shield, project toward the line of pallet travel through any given sputtering chamber. Shield 2230 also features shield extension 2231 which similarly projects toward the line of pallet travel. Peripheral flanges 2232 and 2234 and shield extension 2231 block deposition from high- and low-angle flux (vector A) as disk substrates 510 enter and exit each sputtering chamber, while providing an unhindered path for normal flux (vector B) to the substrates.

FIGS. 25 and 26 illustrate the configuration of cathode 2222 in more detail. Cooling lines 2552 discharge cooling fluid along surface 2550 in shallow channels 2554 and an O-ring (not shown) disposed in channel 2556 prevents coolant leakage outside of channels 2554. On the reverse side of cathode 2222, surface 2658 is adapted to receive screws in holes 2660 for mounting cathodes 2222–2225 onto chamber doors 1201 and 120-2. Surface 2658 is configured to support and receive a magnet and magnetic pole piece assembly to produce the desired magnetic field. The assembly is created in a network of channels in surface 2658 consisting of center channel 2662, intermediate circumferential channel 2664 and outer circumferential channel 2666. Channels 2664 and 2666 are configured as concentric closed loops or ovals surrounding center channel 2662.

Typically, target utilization in sputtering operations are about 15–20% for nonmagnetic materials and about 30–35% for magnetic materials. Considering the high costs associated with the purchase and replacement of target materials, optimal target utilization is another prime concern in sputtering operations. Magnet and magnetic pole piece assemblies used in the present invention substantially improve target utilization, enhancing both production throughputs and cost-effectiveness.

FIGS. 27A and 27B illustrate in greater detail the magnet and magnetic pole piece assemblies for nonmagnetic (e.g., chromium and carbon) and magnetic (e.g., CoCrTa) targets, respectively. Each magnet 2768 is 1-inch long by ⁵⁄₁₆-inch wide by ³⁄₁₆-inch thick and magnets 2769 are 1-inch-long by ⁵⁄₁₆-inch wide by ³⁄₈-inch thick, with north and south pole directions indicated by arrows pointing up and down, respectively. Ferritic magnets of neodymium, iron and boron (NeFeB or "Neo iron") are preferred in the present invention.

Along with magnets 2768 and 2769, magnetic pole pieces 2770 and 2774 are arrayed in channels 2662, 2664 and 2666. Magnetic pole pieces 2770 may be adapted to receive screws therethrough for securing the magnet and pole piece assembly within the channels as necessary. A nonmagnetic material 2772, such as aluminum in block or continuous form, is positioned so as to fill the channels as necessary and preclude shunting of the magnetic flux between adjacent magnetic pole pieces 2770. Iron plate 2274 serves as a backing plate for the magnet and pole piece assembly.

For a nonmagnetic target layout, center channel 2662 of each cathode contains about 25 magnets 2769 separated by ¼-inch spaces and 25-inch pole piece strips 2770 above and below magnets 2769. Intermediate circumferential channel 2664 contains about 35 magnets 2768 separated by 1-inch spaces, two 31-inch pole piece strips 2770, two 31-inch pole piece strips 2774 adjacent to aluminum filler 2772 with additional pole pieces 2770 for fitting the cropped corners of intermediate channel 2664. Outer circumferential 2666 contains about 33 magnets 2769 and two 33-inch pole piece strips 2770 with additional pole pieces 2770 for fitting the cropped corners of outer circumferential channel 2666. The overall effect of the magnet and the pole piece assembly for the nonmagnetic target shown in FIG. 27A is to produce a magnetic field strength above the target surface of 400 Gauss at the center of the erosion region.

For a magnetic target layout, center channel 2662 contains about 25 magnets 2769 with one overlying 25-inch pole piece 2770. Intermediate circumferential channel 2664 contains about 35 magnets 2768 overlaid with two 31-inch pole pieces 2770 and additional pole pieces 2770 for fitting the cropped corners of intermediate channel 2664. Aluminum filler material 2772, in block or continuous form, occupies remaining vacancies in intermediate channel 2664. The overall effect of the magnet and pole piece assembly for a magnetic target shown in FIG. 27B is to produce a magnetic field strength of about 400 Gauss at the center of the erosion region.

As noted above, the purpose of the magnetic field is to trap electrons and ionized species in the plasma and enhance the sputtering rate induced by the circulating plasma above the target surface. The magnetic field 2700 generated by the magnet and magnetic pole piece assemblies used in the present invention approximate an ideal magnetic field 2700 where the vertical components of the magnetic fields above the nonmagnetic (FIG. 27A) and magnetic (FIG. 27B) targets are reduced. As a result, greater target utilization is obtained since the magnetic fields and plasma are focused across a relatively greater portion of the target surface.

Target utilization may be further improved by increasing the magnet loading density within the channel network. For example, by loading intermediate channel 2664 with 24 magnets 2768 separated by ½-inch spaces, nonmagnetic target utilization increases to between 50% and 65%. For magnetic targets, an increased utilization of between 35% to 50% may result.

Figure 28:
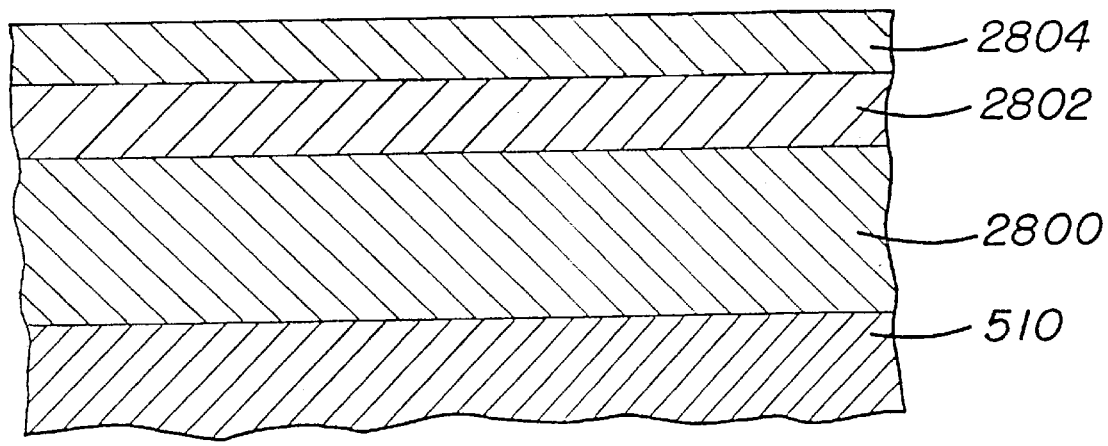
FIG. 28 is a cross sectional view of the multi-layer sputtered thin film created by the process of the present invention.
Figure 29:
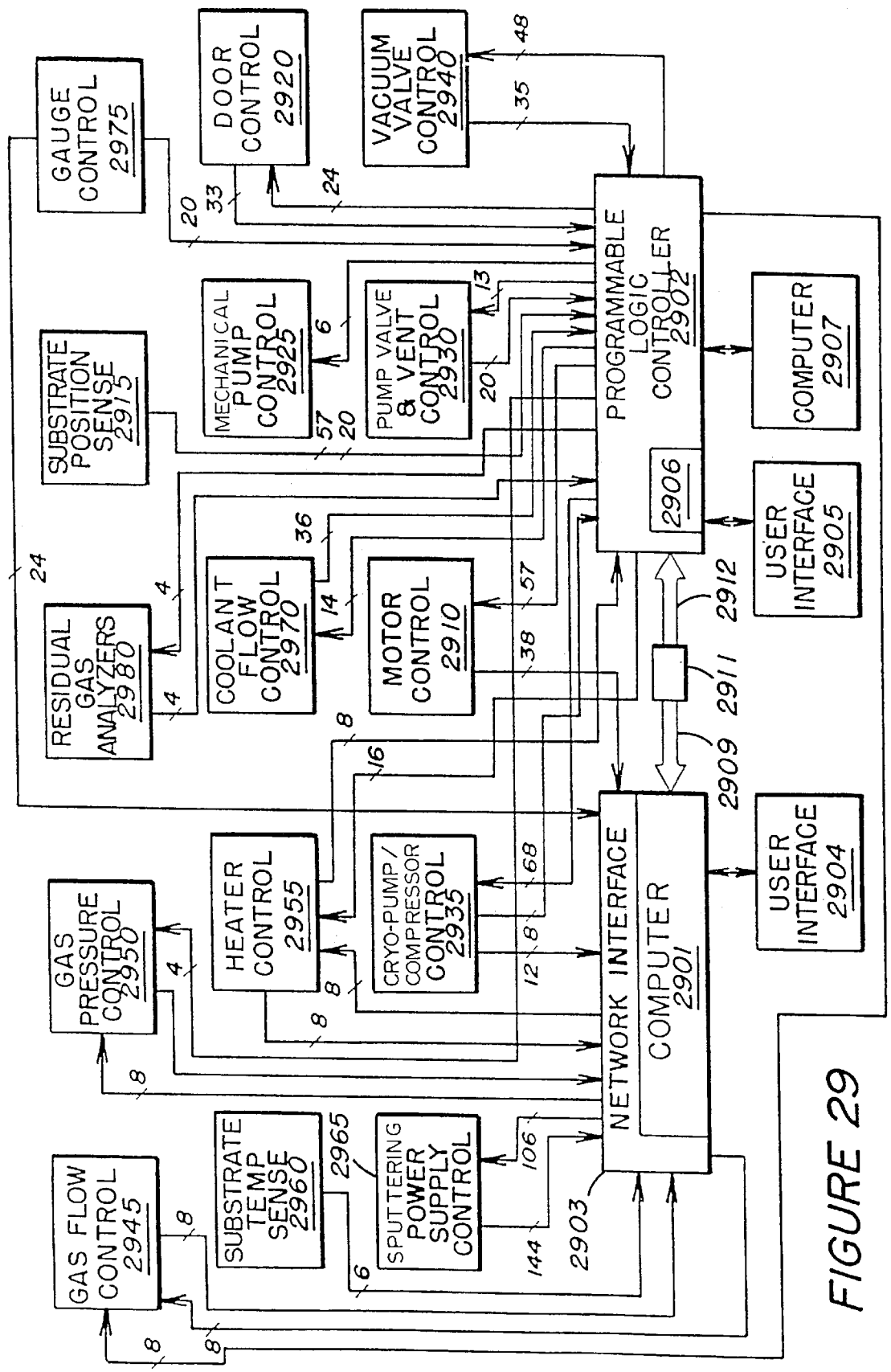
FIG. 29 is a block diagram of the electronic control system of the present invention.
Figure 32A:
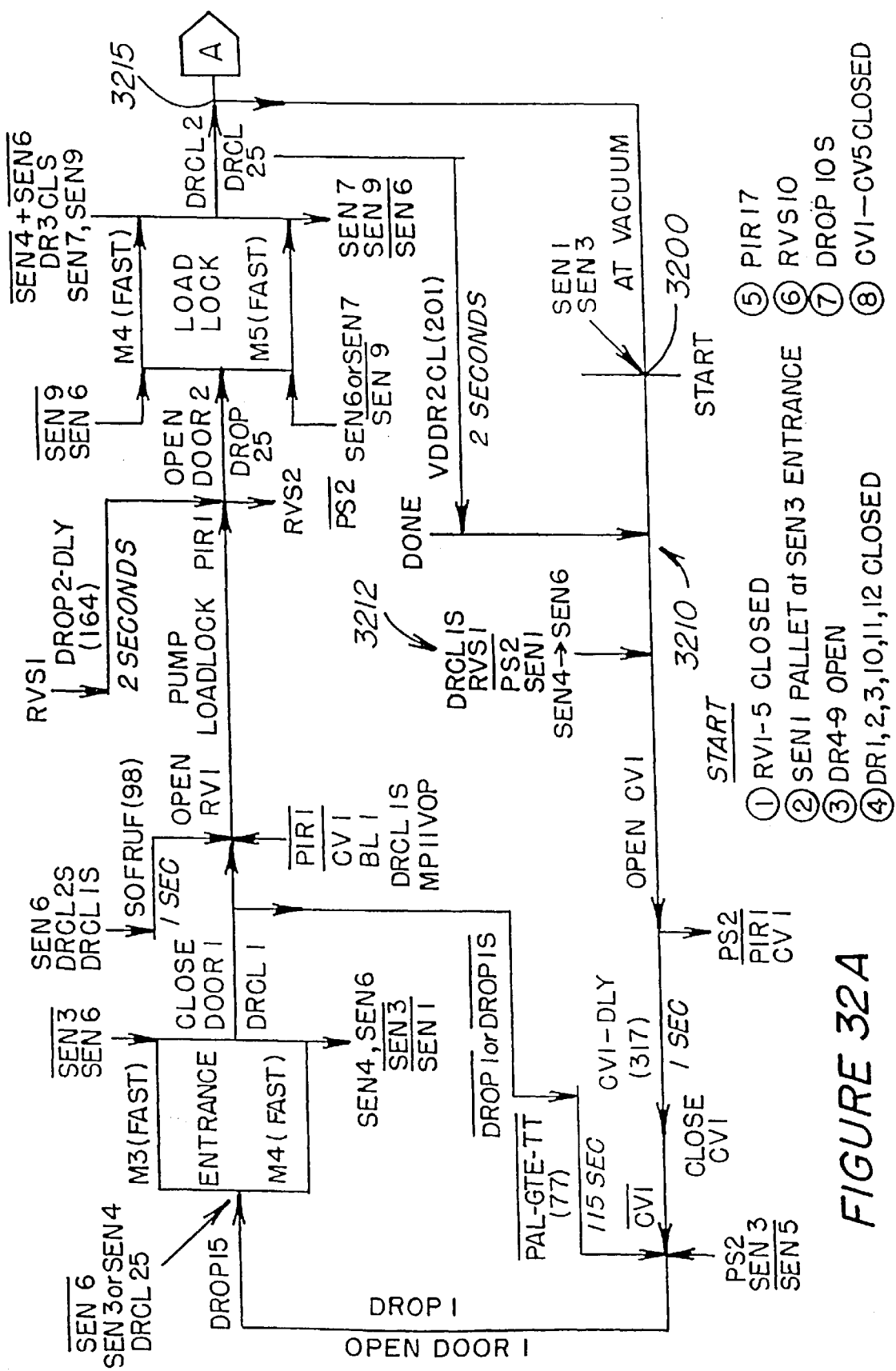
FIGS. 32A through 32E comprise a single logical flow diagram outlining the software logic controlling the motor assemblies, load lock and exit lock pumping, and heater power during the automatic substrate run mode of the software utilized in the electronic control system of the present invention.
Figure 32B:
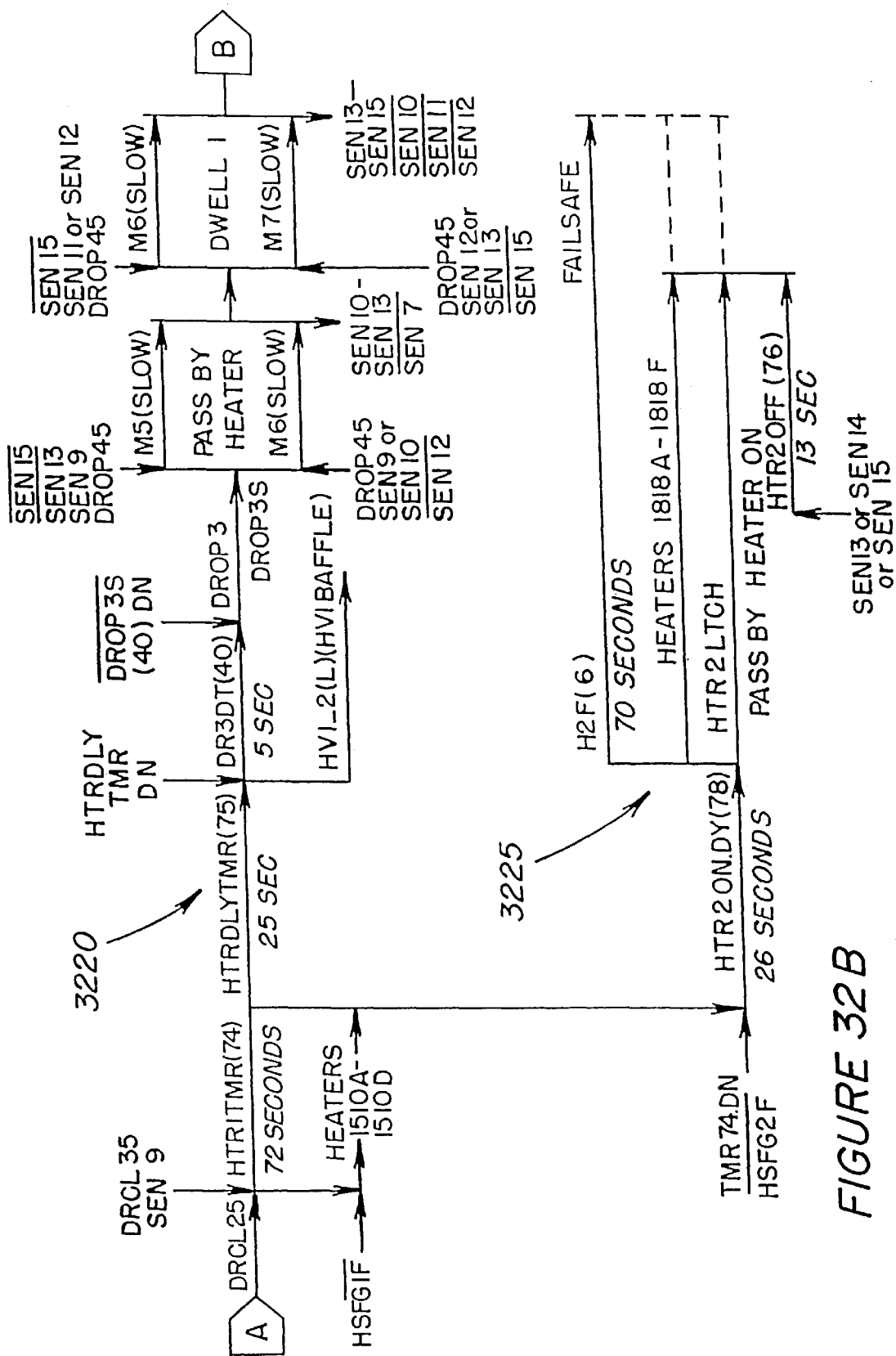
Figure 32C:
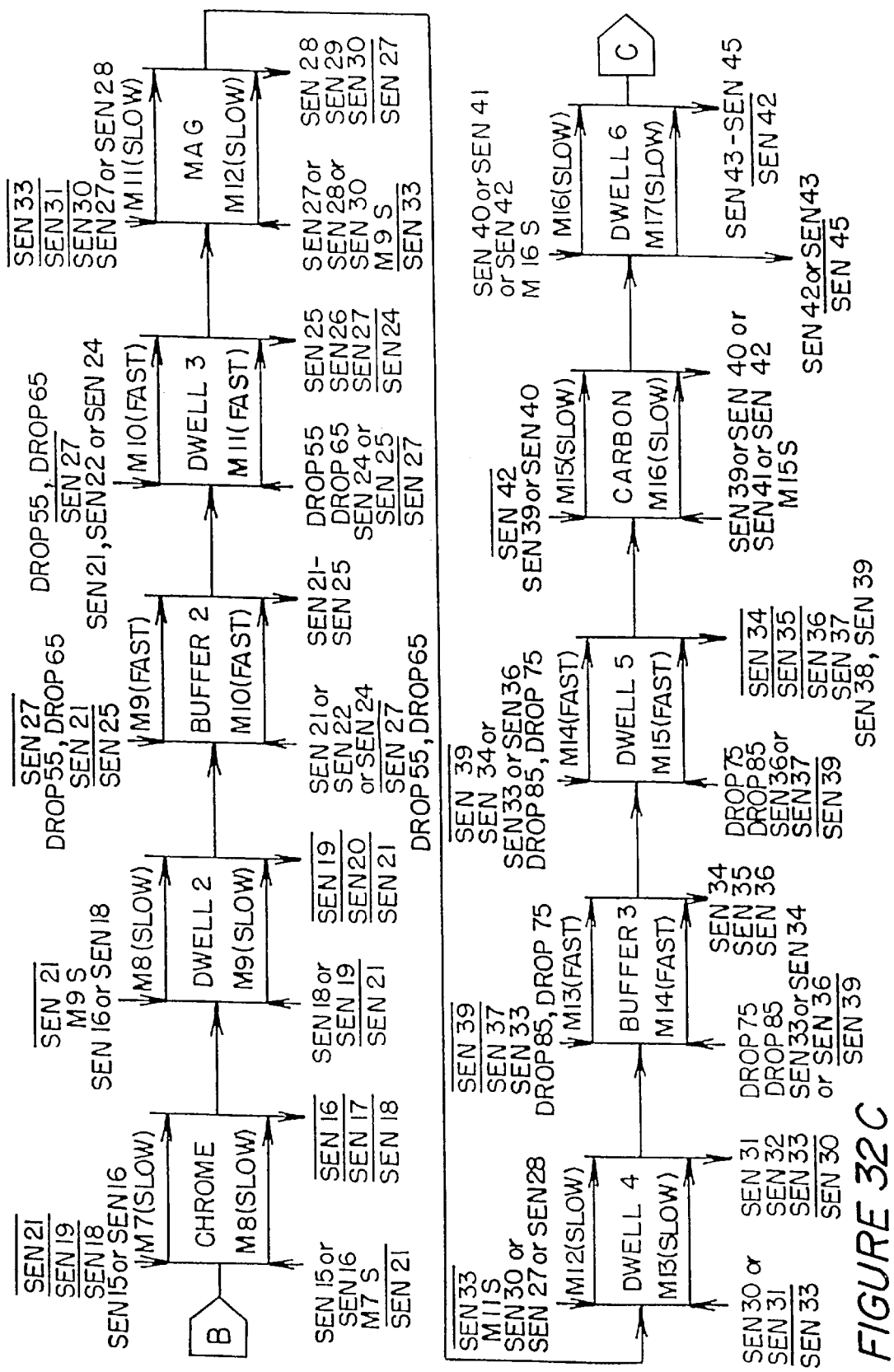
Figure 32D:
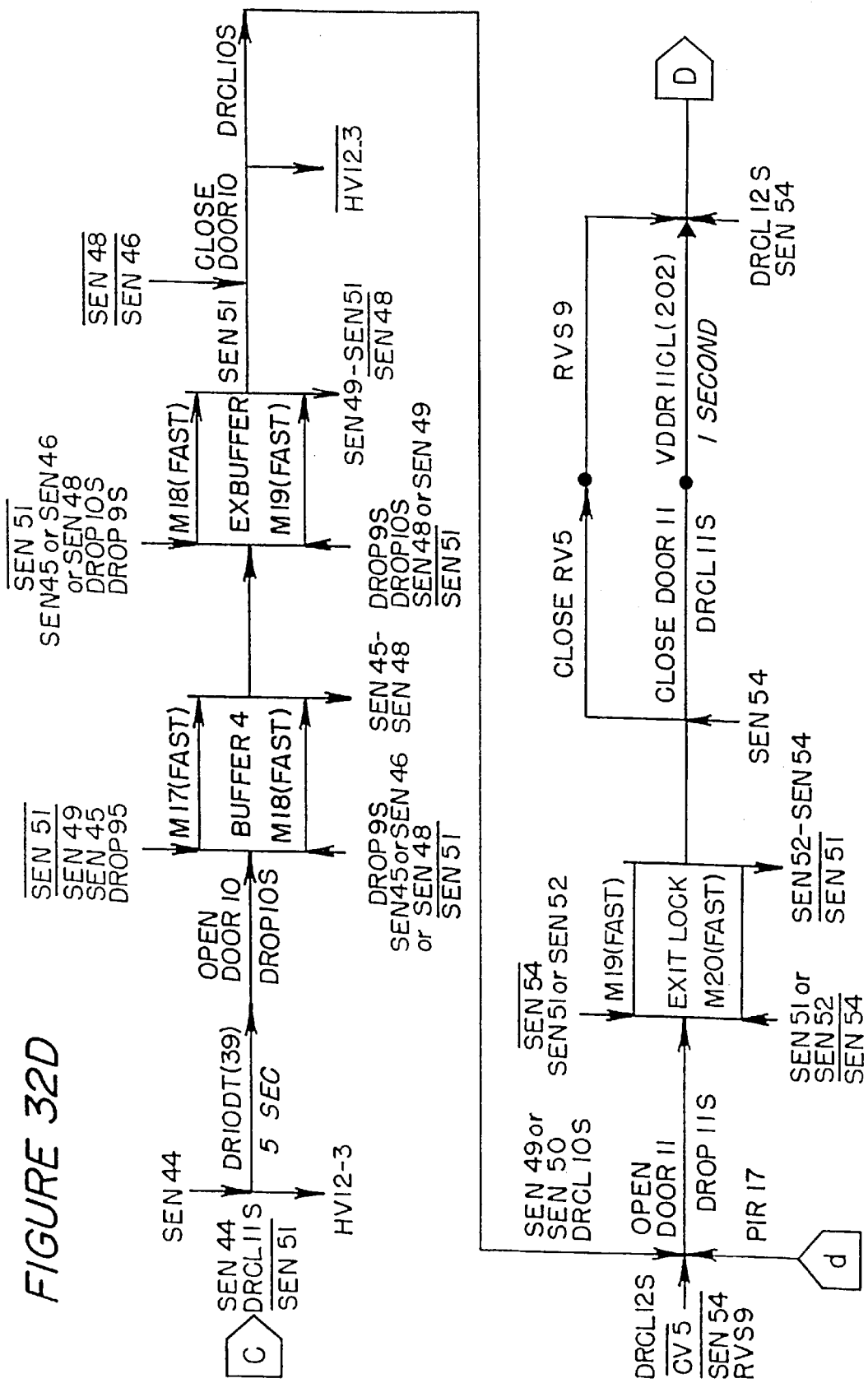
Figure 32E:
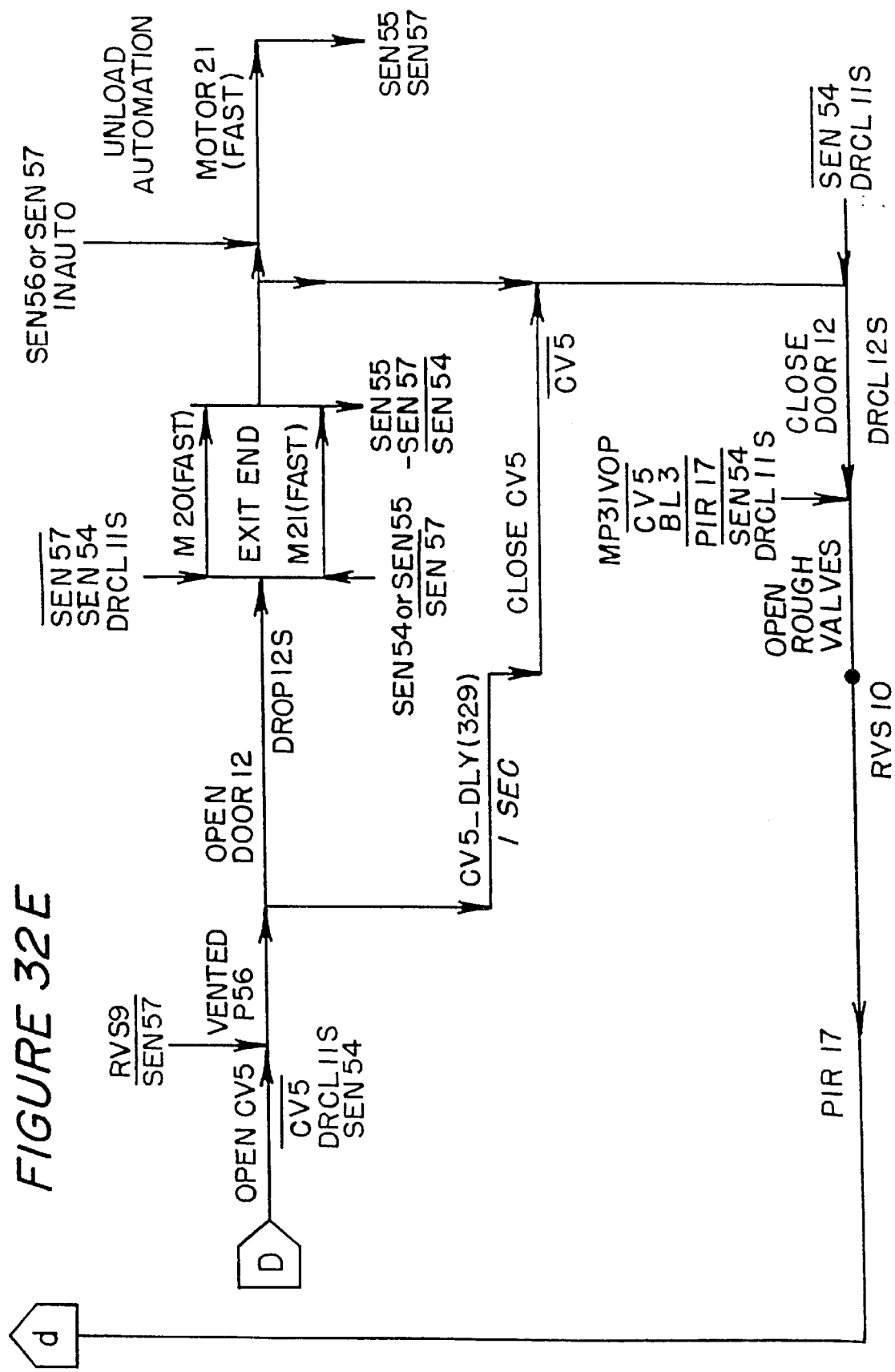

FIG. 28 illustrates the film structure which may be produced by the present invention on nickel-phosphorus plated aluminum disk substrate 510. A 800 Å to 2000 Å (1000 Å preferably) chromium underlayer 2800 is deposited first on disk substrate 510. A 500 Å to 850 Å CoCrTa magnetic layer 2802 may be deposited over the chromium underlayer. As a result of the circumferential texturing of the disk surface as discussed previously in Section C.2, the 'C' axis of the hcp structure of the magnetic cobalt alloy is aligned in the film plane. Finally, a 350 Å carbon overlayer 2804 may be deposited, incorporating some hydrogen, as discussed in Section J.

J. Carbon Sputtering

Sputtering chamber design in sputtering apparatus 10 for carbon films requires additional refinements to optimize wear and corrosion resistance properties. These refinements are discussed herein with reference to FIG. 13, as necessary.

Experiments have shown that the incorporation of hydrogen into sputtered carbon films improves wear-resistance properties. In sputtering apparatus 10, hydrogen incorporation is achieved by sputtering in an argon atmosphere containing up to about 15% of a hydrocarbon gas. In particular, carbon films sputtered in the presence of ethylene/argon or acetylene/argon showed a 300% improvement in wear resistance as compared to carbon films sputtered in pure argon atmospheres. Thus, as compared to chromium and magnetic sputtering chambers 20 and 26, carbon sputtering chamber 28 uses a gas line for argon/hydrocarbon gas mixture to supply hydrocarbon gas flow during sputtering.

A second type of chamber refinement in the carbon sputtering chamber relates to the need for substrate bias. As noted above, during sputtering, primary or "fast" electrons dislodge from the target and join the plasma. These fast electrons are constrained to field lines in the plasma where they may ionize argon atoms or may be attracted to positively biased regions within the sputtering chamber. Deposition of dielectric target materials, such as carbon, on surfaces other than the substrate can reduce the electrical conductivity of those surfaces and inhibit the electron grounding thereon. As a result of the reduced electrical evacuated by cryo pump C3 to $10^{-5}$ Torr. The pallet proceeds at 6 ft/min past heat reflective panels 2120.

Pallet 800 enters chromium sputtering chamber 20 maintained at 9–12 microns (9–12 mTorr) of argon pressure with argon flow at 300 standard cubic centimeters per minute (sccm). Pallet 800 travels at 6 ft/min as it passes sputtering targets 2226–2229. The sputtering power is 7.5 kW per cathode, with a 1,000 Å thick chromium film deposited. Transport speed through dwell chamber 22A, buffer chamber 24A and dwell chamber 22B is 12 ft/min through open doors D5 and D6. These three chambers are pumped by cryo pumps C4, C5, and C6. Pallet 800 enters magnetic sputtering chamber 26 maintained at 9–12 microns [9–12 mTorr) of argon by cryo pumps C6 and C7 with argon flow at approximately 400 sccm. The transport speed through sputtering chamber 26 is 6 ft/min. The sputtering power is 7.5 kW per cathode, depositing a 800 Å thick CoCrTa film. Transport speed through dwell chambers 22C and 22D and buffer chamber 24B is 6 ft/min. Dwell chambers 22C, 22D and buffer chamber 24B are pumped by cryo pumps C7, C8 and C9. Pallet 800 enters carbon sputtering chamber 28 maintained at 9–10 microns (9–12 mTorr) by cryo pumps C9 and C10 with argon and up to 15% hydrocarbon gas like ethylene or acetylene flowing at 100 sccm. The transport speed is 2.8 ft/min as the pallet passes the sputtering targets in carbon sputtering chamber 28. Sputtering power is 7 kW per cathode with a film thickness of 350 Å. Transport speed through dwell chamber 22E, buffer chamber 24C and exit buffer chamber 29 is 6 ft/min with doors D9 and D10 opening and closing sequentially to allow pallet 800 to proceed. Dwell chamber 22E is pumped by cryo pumps C10 and C11, buffer chamber 24C and exit buffer chamber 29 are pumped by cryo pump C12. Argon is backfilled into exit buffer chamber 29 by cryo pump C12 to equalize the pressure differential existing with respect to exit lock chamber 30. Pallet 800 next proceeds through exit lock chamber 30 which is vented to the atmosphere by chamber vent valve CV5 in 10 seconds. Pallet 800 then proceeds to robotic unloading station 45.

To produce a 1,200 Oe magnetic film, the soak time in dwell heating chamber 14 may be increased to about 50 seconds to allow the substrate temperature to increase to approximately 250° C. and/or the pallet transport speed through chromium sputtering chamber 20 may be reduced in order to allow a thicker deposition of a chromium underlayer. Adjustment of soak time and/or substrate temperature parameters depends on the life cycle of the pallet—a pallet which has proceeded through numerous sputtering runs will have a thicker film deposition which can absorb more water and consequently would have more water to outgas before film deposition.

The many features and advantages of the apparatus and process of the present invention will be apparent to those skilled in the art from the description of the preferred embodiments and the drawings.

Thus, a high throughput process and apparatus which accomplishes the objectives of the invention and provides the above advantages by providing a comprehensive in-line sputtering system utilizing matched component elements to process multiple large single sheet or pallet transported discrete substrates in a continuous, variable speed, sputtering process has been described. Such an apparatus and method can process up to 3,000 95 mm disk substrates, and 5,300 65 mm disk substrates, per hour. Such high volume production offers both high volume production and, consequently, cost savings per disk on the order of $4.00 per disk over prior art sputtering apparatus and processes. As noted throughout this specification, such an apparatus and process is achieved through a novel combination of process and structural elements involved in disk preparation, provision of a sputtering environment, transportation of substrates through the sputtering environment at rapid speeds and in a contaminant free manner, heating the substrates to optimal thermal levels for sputtering, and sputtering the substrates through a series of substantially isolated, non-crosscontaminating sputtering steps.

The apparatus of the present invention provides a high-speed in-line sputtering apparatus for producing superior multilayer films on substrates, such as disks suitable for use in Winchester-type hard disk drives. The process of the present invention provides an improved method of providing multilayer coatings to a variety of substrate types at a much greater rate than prior art methods.

Also described herein are a novel means for heating substrates to be coated, a novel sputtering magnetron design, a novel, variable speed, overhead, non-contaminating substrate transportation system and a comprehensive, centralized, programmable electronic means for controlling the apparatus and process are provided. Still further, when she process and apparatus are used for providing magnetic coatings for substrates, such as disks, to be utilized in hard disk drives using Winchester-type technology, a unique disk texturing method for improving the disk's magnetic recording properties, and a novel disk carrier (or pallet) design which contributes to uniform substrate heating characteristics in a large, single, high capacity pallet, are also provided herein. Numerous variations are possible as will be apparent to those skilled in the art; such variations are intended to be within the scope of the invention as defined by this specification and the following claims are intended to cover all the modifications and equivalents falling within the scope of the invention.

What is claimed is:

1. A high throughput sputtering apparatus for providing a single or multi-layer coating to the surface of a plurality of substrates, said apparatus comprising:
   a plurality of buffer and sputtering chambers, said sputtering chambers including:
      a plurality of planar cathodes, each with first and second surfaces, wherein the cathodes are mounted within said sputtering chambers in a plane oriented substantially parallel to a plane including the plurality of substrates,
      a plurality of targets positioned on the first surfaces to provide sources for films to be sputtered,
      magnet means for generating magnetic flux lines over the first surfaces and the targets, which lines are sufficient to support sputtering and form substantially horizontal flux paths parallel to the first surfaces and the targets, and
      a shield for shielding the substrates from obliquely incident deposition from the targets, the shield including flanges extending from the cathodes and projecting toward the substrates.

2. A sputtering apparatus according to claim 1, further comprising:
   a plurality of channels configured in the second surfaces to receive and support the magnet means in an arrangement based upon the composition of the plurality of targets.

3. A sputtering apparatus according to claim 1, further comprising:
   a means for cooling the plurality of cathodes, the means for cooling disposed on the second surfaces to protect the magnet means from corrosion.

4. A sputtering apparatus for providing multilayered thin films on substrates for magnetic recording media, comprising:
   a) a first chamber along a substrate transport path to provide a controlled sputtering environment for an underlayer of the film;
   b) a second chamber along the path and isolated from the first chamber, the second chamber providing a controlled sputtering environment for a magnetic layer of the film;
   c) a third chamber along the path and isolated from the first and second chambers, the third chamber providing a controlled sputtering environment for a protective overlayer of the film;
   d) a plurality of planar cathodes, each with first and second surfaces, wherein the cathodes are mounted within the chambers, the surfaces being parallel to the path;

e) a first target disposed on each of the first surfaces of the cathodes mounted within the first chamber, the first target having a nonmagnetic composition to provide the underlayer;

f) a second target disposed on each of the first surfaces of the cathodes mounted within the second chamber, the second target having a magnetic composition to provide the magnetic layer;

g) a third target disposed on each of the first surfaces of the cathodes mounted within the third chamber, the third target having a nonmagnetic composition to provide the protective overlayer;

h) a plurality of channels disposed in the second surfaces;

i) magnet means disposed in the channels, the magnet means arrayed to optimize target utilization based on the composition of the respective targets;

j) a means for cooling the cathodes, the means for cooling disposed in the second surfaces to protect the magnet means from corrosion; and k) a shield for shielding the substrates from obliquely incident deposition from the targets, the shield including flanges extending from the cathodes and projecting toward the substrates.

5. An in-line sputtering apparatus according to claim 4, wherein the first target is comprised of chromium.

6. An in-line sputtering apparatus according to claim 4, wherein the second target is comprised of cobalt, chromium and tantalum.

7. An in-line sputtering apparatus according to claim 4, wherein the third target is comprised of carbon.

* * * * *